US011335697B2

(12) United States Patent
Kanamori et al.

(10) Patent No.: US 11,335,697 B2
(45) Date of Patent: May 17, 2022

(54) VERTICAL MEMORY DEVICES HAVING CONTACT PLUGS VERTICALLY EXTENDING THROUGH PLURALITY OF GATE ELECTRODES AND CONTACTING LOWER CIRCUIT PATTERN

(71) Applicant: Samsung Electronics Co., Ltd., Suwon-si (KR)

(72) Inventors: Kohji Kanamori, Seoul (KR); Min-Yeong Song, Seoul (KR); Shin-Hwan Kang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/819,907

(22) Filed: Mar. 16, 2020

(65) Prior Publication Data

US 2020/0219898 A1 Jul. 9, 2020

Related U.S. Application Data

(63) Continuation of application No. 15/496,485, filed on Apr. 25, 2017, now abandoned.

(30) Foreign Application Priority Data

May 9, 2016 (KR) .......................... 10-2016-0056153

(51) Int. Cl.
*H01L 27/11582* (2017.01)
*H01L 27/11565* (2017.01)
*H01L 27/11573* (2017.01)
*H01L 27/11575* (2017.01)
*H01L 27/06* (2006.01)

(52) U.S. Cl.
CPC .... *H01L 27/11582* (2013.01); *H01L 27/0688* (2013.01); *H01L 27/11565* (2013.01); *H01L 27/11573* (2013.01); *H01L 27/11575* (2013.01)

(58) Field of Classification Search
CPC .......... H01L 27/0688; H01L 27/11565; H01L 27/11573; H01L 27/11575; H01L 27/11582
See application file for complete search history.

(56) References Cited

U.S. PATENT DOCUMENTS 6,838,326 B2   1/2005 Kwon
8,288,816 B2   10/2012 Komori et al.
(Continued)

FOREIGN PATENT DOCUMENTS

KR   10-0260520 B1   8/2000
KR   2015-0116995 A   10/2015

*Primary Examiner* — Anh D Mai
(74) *Attorney, Agent, or Firm* — Harness, Dickey & Pierce, P.L.C.

(57) ABSTRACT

A vertical memory device includes a lower circuit pattern on a substrate, a plurality of gate electrodes spaced apart from another in a first direction substantially perpendicular to an upper surface of the substrate on the lower circuit pattern, a channel extending through the gate electrodes in the first direction, a memory cell block including a first common source line (CSL) extending in a second direction substantially parallel to the upper surface of the substrate, and a first contact plug connected to the lower circuit pattern and the first CSL and overlapping the first CSL in the first direction.

20 Claims, 33 Drawing Sheets

(56) References Cited

U.S. PATENT DOCUMENTS

| | | | |
|---|---|---|---|
| 8,338,882 B2* | 12/2012 | Tanaka | H01L 27/11582 |
| | | | 257/324 |
| 8,643,142 B2 | 2/2014 | Higashitani et al. | |
| 2013/0248975 A1 | 9/2013 | Hishida et al. | |
| 2014/0061747 A1 | 3/2014 | Tanzawa et al. | |
| 2015/0129878 A1 | 5/2015 | Shin et al. | |
| 2015/0206587 A1 | 7/2015 | Hasegawa et al. | |
| 2015/0221666 A1 | 8/2015 | Lee | |
| 2015/0263011 A1 | 9/2015 | Hong | |
| 2015/0325588 A1 | 11/2015 | Lee et al. | |
| 2016/0163732 A1* | 6/2016 | Lim | H01L 23/528 |
| | | | 257/314 |

* cited by examiner

VERTICAL MEMORY DEVICES HAVING CONTACT PLUGS VERTICALLY EXTENDING THROUGH PLURALITY OF GATE ELECTRODES AND CONTACTING LOWER CIRCUIT PATTERN

CROSS-REFERENCE TO RELATED APPLICATIONS

This application is a non-provisional continuation application of U.S. patent application Ser. No. 15/496,485, filed on Apr. 25, 2017, now abandoned, which claims priority under 35 U.S.C. § 119 to Korean Patent Application No. 10-2016-0056153 filed on May 9, 2016 in the Korean Intellectual Property Office (KIPO), the contents of each of which are incorporated by reference herein in their entirety.

BACKGROUND

The example inventive concepts generally relate to a vertical memory device, and more particularly, inventive concepts relate to a vertical non-volatile memory device having a cell over periphery, or cell over peri (COP) structure in which peripheral circuits and memory cells are vertically stacked.

In a vertical NAND flash memory device having a COP structure, a contact plug may be formed in order to connect lower peripheral circuits to upper wirings, and the contact plug may be formed at the outskirts of a memory cell array. Thus, an additional space and an additional process for forming the contact plug are needed or desired.

SUMMARY

Example embodiments provide a COP structure vertical memory device having good electrical characteristics.

According to example embodiments of inventive concepts, there is provided a vertical memory device. The vertical memory device may include a lower circuit pattern on a substrate, a plurality of gate electrodes spaced apart from another in a first direction substantially perpendicular to an upper surface of the substrate on the lower circuit pattern, a channel extending through the gate electrodes in the first direction, a memory cell block including a first common source line (CSL) extending in a second direction substantially parallel to the upper surface of the substrate, and a first contact plug connected to the lower circuit pattern and the first CSL and overlapping the first CSL in the first direction.

According to example embodiments of inventive concepts, there is provided a vertical memory device. The vertical memory device may include a lower circuit pattern on a substrate, a plurality of gate electrodes spaced apart from another in a first direction substantially perpendicular to an upper surface of the substrate on the lower circuit pattern, the plurality of gate electrodes being, a channel extending through the gate electrodes in the first direction, a memory cell block including a plurality of conductive patterns in a second direction substantially parallel to the upper surface of the substrate, and a first contact plug connected to the lower circuit pattern. At least one of the conductive patterns may extend through at least a portion of the gate electrodes, and the first contact plug may be under the conductive patterns.

According to example embodiments of inventive concepts, there is provided a vertical memory device. The vertical memory device may include a lower circuit pattern on a substrate, a plurality of memory cell blocks in a first direction substantially perpendicular to an upper surface of the substrate, a first CSL at a central portion of each memory cell block in the first direction, a memory cell array including a second CSL between neighboring ones of the memory cells in the first direction, and a first contact plug connected to the lower circuit pattern under the first CSL.

In the vertical memory device, the lower contact plug for electrically connecting the lower circuit pattern and the upper wirings may vertically overlap the CSL or the upper contact plugs in each memory cell block.

Thus, no additional area for forming the lower contact plug may be needed or desired, and thus the vertical memory device may have a reduced size and the process for forming the lower contact plug may be simple.

BRIEF DESCRIPTION OF THE DRAWINGS

The above and other aspects and features of inventive concepts will become readily understood from the detail description that follows, with reference to the accompanying drawings, in which like reference numbers refer to like elements unless otherwise noted, and in which.

DETAILED DESCRIPTION

When the terms "about," "practically" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of example embodiments. Although the tubular elements of the embodiments may be cylindrical, other tubular cross-sectional forms are contemplated, such as square, rectangular, oval, triangular and others.

Figure 1:
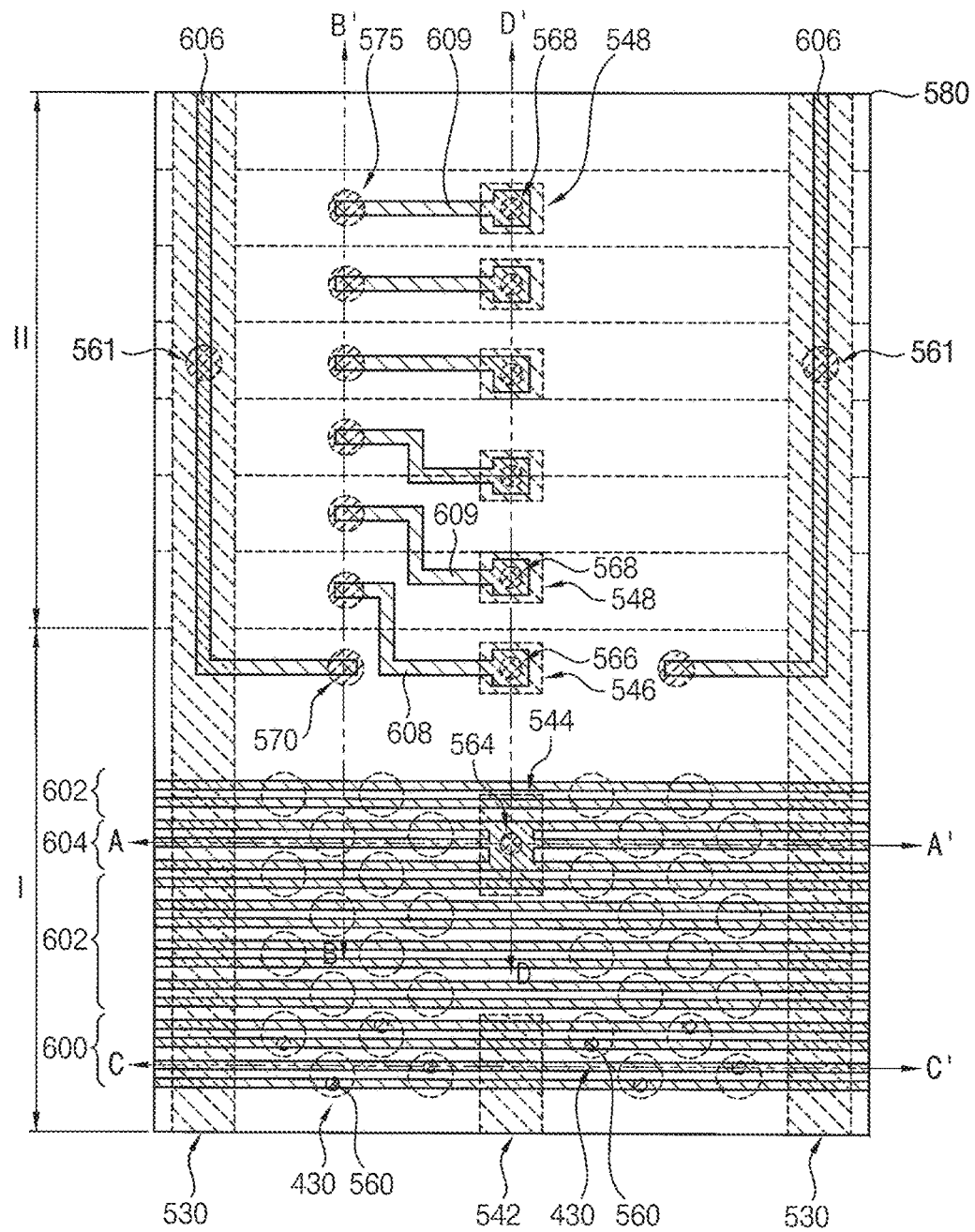
FIGS. 1 to 7 are plan views and cross-sectional views illustrating a vertical memory device in accordance with example embodiments.
Figure 2:
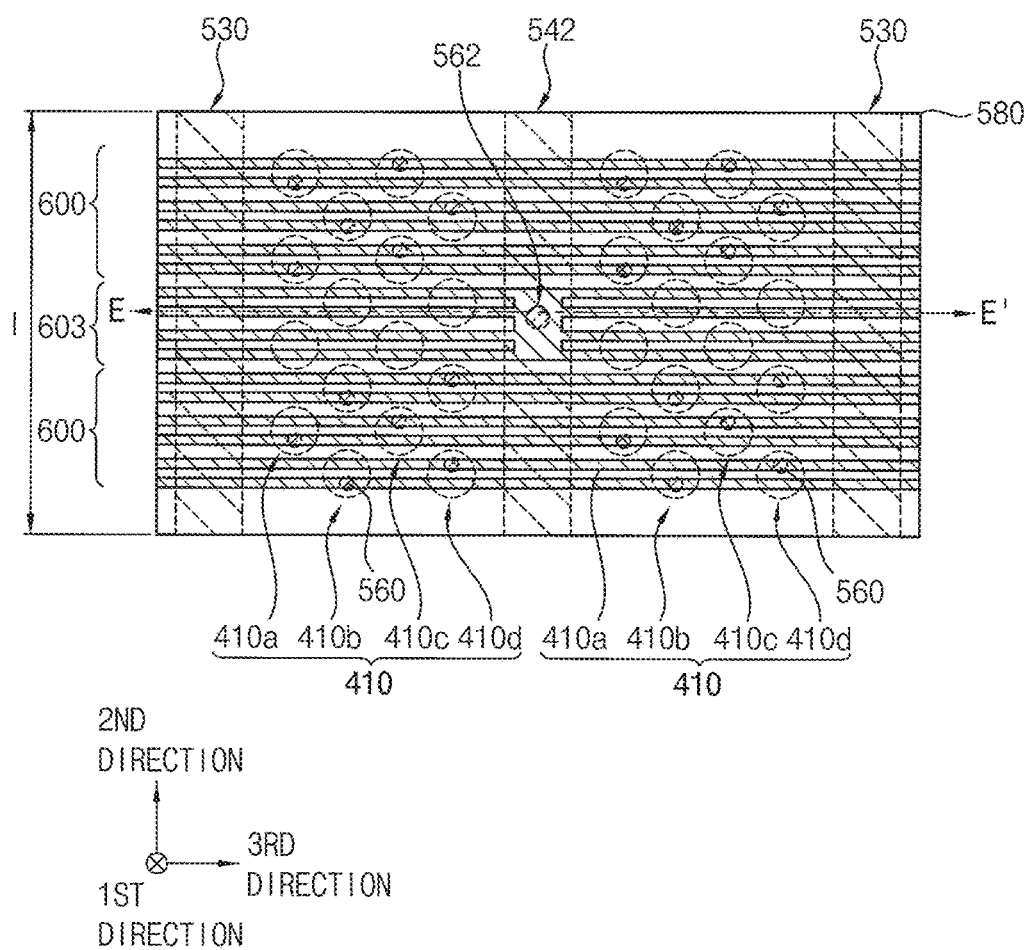

FIGS. 1 to 7 are plan views and cross-sectional views illustrating a semiconductor device, such as a vertical memory device in accordance with example embodiments. Particularly, FIGS. 1 and 2 are plan views, and FIGS. 3 to 7 are cross-sectional views.

Figure 4:
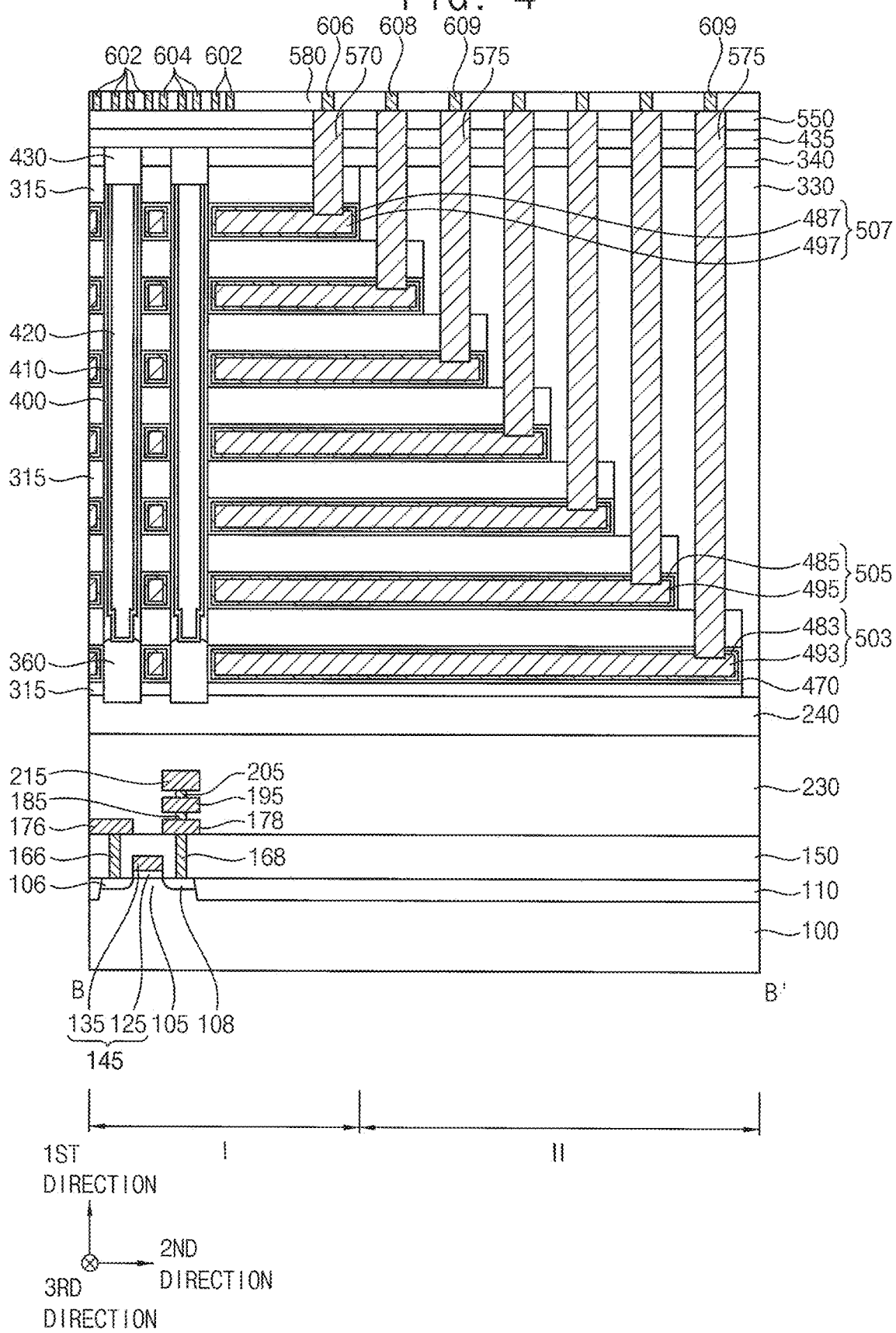
Figure 5:
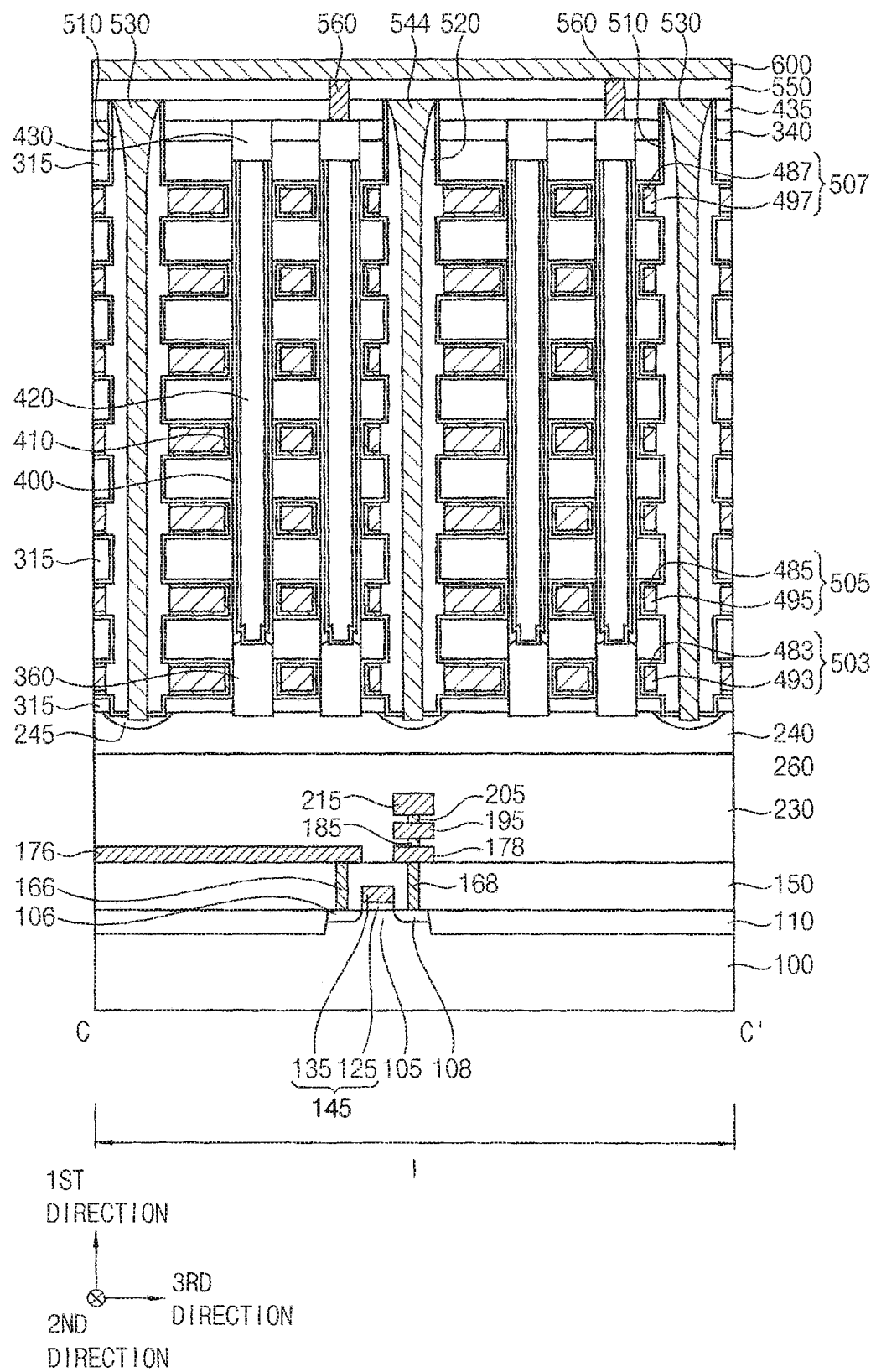
Figure 6:
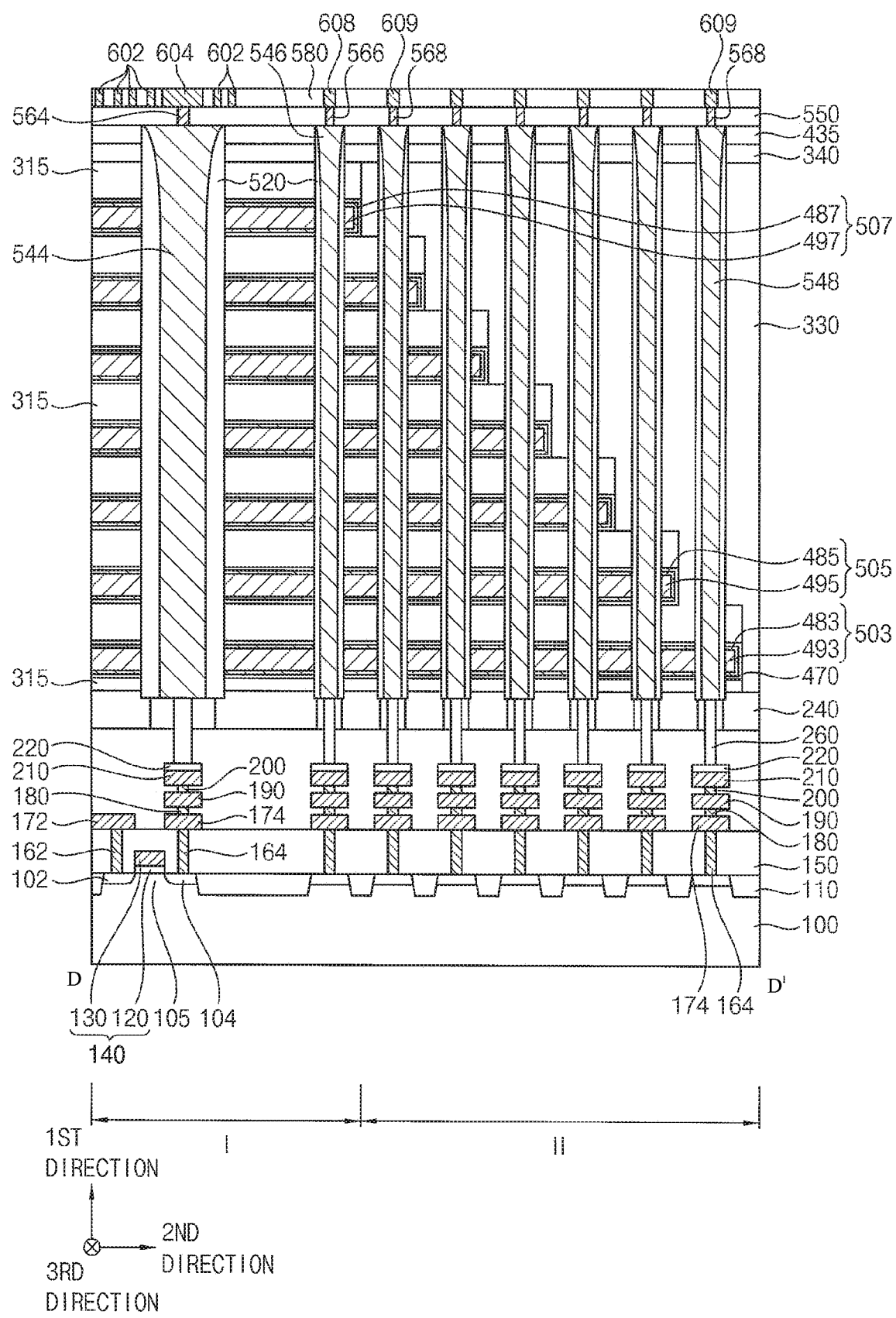
Figure 7:
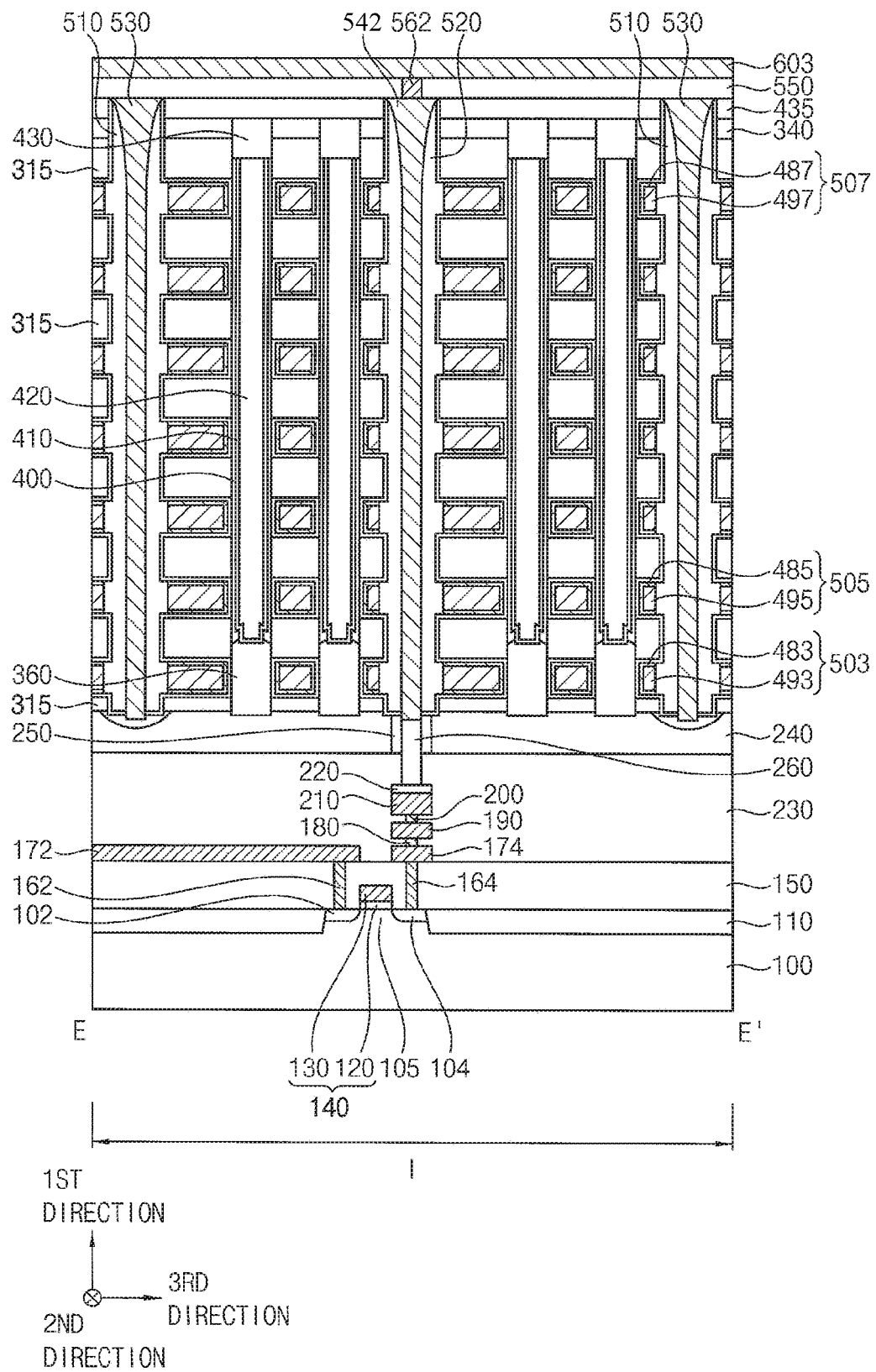

FIG. 1 is a plan view of an edge portion of a first region and a second region of a substrate, and FIG. 2 is a plan view of a central portion of the first region of the substrate. FIG. 3 is a cross-sectional view taken along a line A-A' of FIG. 1, FIG. 4 is a cross-sectional view taken along a line B-B' of FIG. 1, FIG. 5 is a cross-sectional view taken along a line C-C' of FIG. 1, FIG. 6 is a cross-sectional view taken along a line D-D' of FIG. 1, and FIG. 7 is a cross-sectional view taken along a line E-E' of FIG. 1.

Figure 3A:
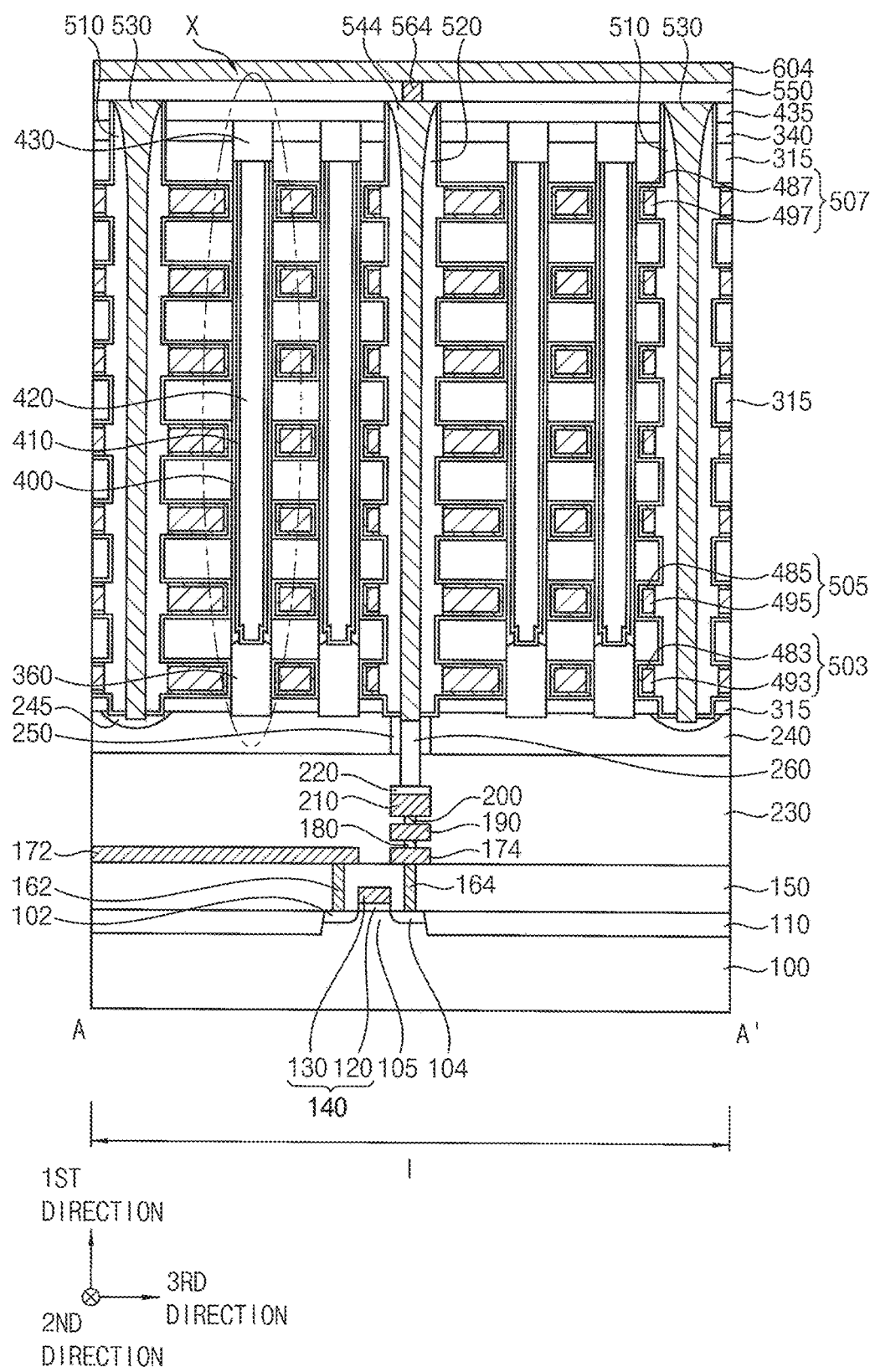
Figure 3B:
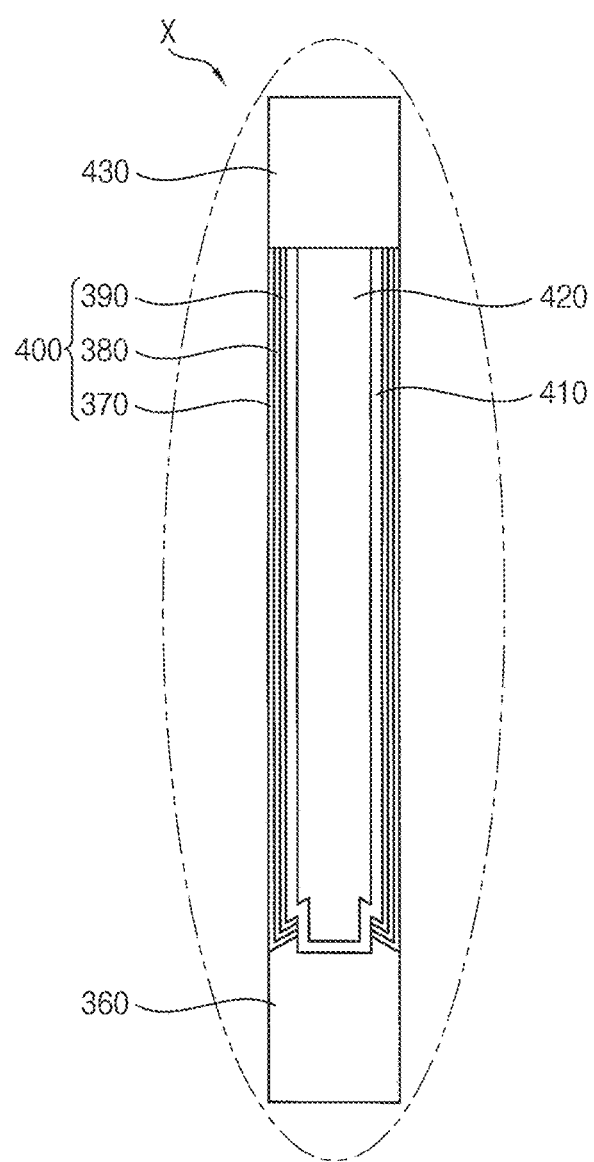

FIG. 3B is an enlarged cross-sectional view of a region X of FIG. 3A.

For purposes of illustration, a direction substantially perpendicular to an upper surface of the substrate is defined as a first direction, and two directions substantially parallel to the upper surface of the substrate and crossing each other are defined as second and third directions, respectively. In example embodiments, the second and third directions may be substantially perpendicular to each other.

Referring to FIGS. 1 to 7, the vertical memory device may include a lower circuit pattern, memory cells over the lower circuit pattern, and a fifth contact plug 260 for electrically connecting the lower circuit pattern to the memory cells on a substrate 100. The vertical memory device may further include ninth to sixteenth contact plugs 560, 561, 562, 564, 566, 568, 570 and 575, a bit line 600, first and second dummy bit lines 602 and 603, a signal line 604, and ninth to eleventh wirings 606, 608 and 609.

The substrate 100 may include a semiconductor material, e.g., silicon, germanium, silicon-germanium, etc., or III-V semiconductor compounds, e.g., GaP, GaAs, GaSb, etc. In example embodiments, the substrate 100 may be or may include a silicon-on-insulator (SOI) substrate or a germanium-on-insulator (GOI) substrate.

In example embodiments, the substrate 100 may include first and second regions I and II. The first region I may serve as a cell array region in which a memory cell array may be formed, and the second region II may serve as a pad region in which gate electrode pads may be formed. The cell array region together with the pad region may be referred to as a memory cell region.

The substrate 100 may be divided into a field region on which an isolation pattern 110 is formed, and an active region 105 on which no isolation pattern is formed. For example, the isolation pattern 110 may include an oxide, e.g., silicon oxide.

In example embodiments, the vertical memory device may have a COP structure. That is, a circuit pattern may not be formed at an outside of the memory cells but formed under the memory cells. Thus, a circuit pattern region in which the circuit pattern may be formed and the memory cell region may be vertical stacked, and the circuit pattern may not be referred to as a peripheral circuit pattern but referred to as the lower circuit pattern.

The circuit pattern may include transistors, contact plugs, wirings, vias, etc. FIGS. 1 to 7 show first and second transistors, first to fourth contact plugs 162, 164, 166 and 168, first to eighth wirings 172, 174, 190, 200, 176, 178, 195 and 215, and first to fourth vias 180, 200, 185 and 205. However, inventive concepts may not be limited thereto, and a more or a less number of the transistors, contact plugs, wirings and vias may be formed.

The first transistor may include a first lower gate structure 140 on the substrate 100, and first and second impurity regions 102 and 104 at upper portions of the active region 105 of the substrate 100 adjacent thereto. The second transistor may include a second lower gate structure 145 on the substrate 100, and third and fourth impurity regions 106 and 108 at upper portions of the active region 105 of the substrate 100 adjacent thereto. The first and second impurity regions may comprise III-V elements, but inventive concepts are not limited thereto.

The first lower gate structure 140 may include a first lower gate insulation pattern 120 and a first lower gate electrode 130 sequentially stacked on the substrate 100. The second lower gate structure 145 may include a second lower gate insulation pattern 125 and a second lower gate electrode 135 sequentially stacked on the substrate 100. At least one of the first and second lower gate insulation patterns 120 and 125 may include an oxide, e.g., silicon oxide, and at least one of the first and second lower gate electrodes 130 and 135 may include, e.g., a metal, a metal nitride, a metal silicide, metal salicide, doped polysilicon, etc. At least one of the first to fourth impurity regions 102, 104, 106 and 108 may be doped with n-type or p-type impurities.

The first and second transistors may be covered by a first insulating interlayer 150 on the substrate 100, and the first to fourth contact plugs 162, 164, 166 and 168 may extend through the first insulating interlayer 150 to contact the first to fourth impurity regions 102, 104, 106 and 108, respectively.

The first insulating interlayer 150 may include an oxide, e.g., silicon oxide, and at least one of the first to fourth contact plugs 162, 164, 166 and 168 may include a metal, a metal nitride, or doped polysilicon. In an example embodiment, at least one of the first to fourth contact plugs 162, 164, 166 and 168 may include a metal pattern (not shown) and a barrier pattern (not shown) covering a lower surface and a sidewall of the metal pattern.

The first and second wirings 172 and 174 may be formed on the first insulating interlayer 150, and may contact the first and second contact plugs 162 and 164, respectively. The first via 180, the third wiring 190, the second via 200 and the fourth wiring 210 may be sequentially stacked on the second wiring 174. Additionally, the fifth and sixth wirings 176 and 178 may be formed on the first insulating interlayer 150, and may contact the third and fourth contact plugs 166 and 168, respectively. The third via 185, the seventh wiring 195, the fourth via 205 and the eighth wiring 215 may be sequentially stacked on the sixth wiring 178.

At least one of the first to eighth wirings 172, 174, 190, 210, 176, 178, 195 and 215 and at least one of the first to fourth vias 180, 200, 185 and 205 may include a metal, a metal nitride or doped polysilicon. In an example embodiment, at least one of the first to eighth wirings 172, 174, 190, 210, 176, 178, 195 and 215 and at least one of the first to fourth vias 180, 200, 185 and 205 may include a metal pattern (not shown) and a barrier pattern (not shown) covering a lower surface and a sidewall of the metal pattern.

The first to eighth wirings 172, 174, 190, 210, 176, 178, 195 and 215 and the first to fourth vias 180, 200, 185 and 205 may be covered by a second insulating interlayer 230 on the first insulating interlayer 150. The second insulating interlayer 230 may include an oxide, e.g., silicon oxide, and thus may be merged with the underlying first insulating interlayer 150.

In example embodiments, a first capping pattern 220 may be formed on an upper surface of the fourth wiring 210. The first capping pattern 220 may include polysilicon doped with n-type impurities, e.g., phosphorus, arsenic, etc. When the fourth wiring 210 includes a metal, the first capping pattern 220 may hinder or prevent the metal of the fourth wiring 210 from being diffused to neighboring structures.

Unlike the fourth wiring 210, no capping pattern may be formed on an upper surface of the eight wiring 215.

A base layer 240 may be further formed on the second insulating interlayer 230, and a first insulation pattern 250 may be further formed through the base layer 240.

The base layer 240 may include, e.g., a polysilicon layer, or may have a multi-layered structure of a polysilicon layer and a metal layer.

The first insulation pattern 250 may include an oxide, e.g., silicon oxide. In example embodiments, the first insulation pattern 250 may at least partially overlap the underlying first capping pattern 220 in the first direction. The first insulation pattern 250 may have a shape of, e.g., a rectangle, a circle, an ellipse, etc., in a plan view.

The fifth contact plug 260 may extend through the first insulation pattern 250 and an upper portion of the second insulating interlayer 230, and may contact the upper surface of the underlying first capping pattern 220. The fifth contact plug 260 may include polysilicon doped with n-type impurities, e.g., phosphorus, arsenic, etc. The fifth contact plug 260 may have a shape of, e.g., a rectangle, a circle, an ellipse, etc., in a plan view.

The memory cells may be formed over the base layer 240, the first insulation pattern 250 and the fifth contact plug 260.

The memory cells may be in the second and third directions to form a memory cell array. Particularly, the memory cell array may include a plurality of memory cell blocks in the third direction, which may be separated from another by a first common source line (CSL) 530 extending in the second direction. The memory cell block may serve as a unit for operation of programming and erasing in the vertical memory device.

Each memory cell block may include a channel block therein. The channel block may include a plurality of channel groups in the third direction, and may be separated by a second CSL 542 extending in the second direction.

Each channel group may include a plurality of channel columns each containing a plurality of channels 410 in the second direction. In example embodiments, each channel group may include first and second channel columns 410a and 410b spaced apart from another in the third direction. The channels 410 included in the first and second channel columns 410a and 410b may form an acute angle with the second direction and/or the third direction, and the channels 410 in the first and second channel columns 410a and 410b may be in a zigzag layout with respect to the second direction. According as the channels 410 included in the first and second channels are in a zigzag layout, more numbers of channels 410 may be formed in an area.

The first and second channel columns 410a and 410b may be alternately and repeatedly in the third direction in each channel group. In example embodiments, the first and second channel columns 410a and 410b may be in the third direction twice in each channel group, and thus each channel group may include four channel columns therein.

Hereinafter, four channel columns in the third direction in each channel group may be referred to as first, second, third and fourth channel columns 410a, 420b, 430c and 440d, respectively, in this order. That is, FIGS. 1 and 2 show one channel block including two channel groups spaced apart from another in the third direction, and each channel group includes the first, second, third and fourth channel columns 410a, 410b, 410c and 410d in the third direction.

However, the number of the channel columns in each channel group may not be limited thereto, and the number of the channel groups in each channel block may not be limited thereto, either.

Each memory cell block may include a plurality of gate electrodes spaced apart from another in the first direction on the base layer 240, second insulation patterns 315 between the gate electrodes, second structures extending through the gate electrodes and the second insulation patterns 315, the second CSL 542, and sixth to eighth contact plugs 544, 546 and 548.

In example embodiments, at least one of the gate electrodes may extend in the second direction, and a plurality of gate electrodes may be in the third direction. That is, the gate electrodes each extending in the second direction may be spaced apart from another in the third direction by the first CSL 530. Additionally, a central portion of at least one of the gate electrodes in the second direction may be spaced apart from another in the third direction by the second CSL 542.

At least one of the gate electrodes may be formed on the first and second regions I and II of the substrate 100, and a portion of at least one of the gate electrodes on the second region II of the substrate 100 may be referred to as a pad. That is, at least one of the gate electrodes may extend in the second direction on the first and second regions I and II of the substrate 100, and end portions of the gate electrodes on the second region II of the substrate 100 may have respective areas gradually decreasing from a bottom level toward a top level. Thus, the gate electrodes may have a staircase shape.

A sidewall of the staircase shaped structure may be covered by a third insulating interlayer pattern 330 on the base layer 240, and a fourth insulating interlayer 340 may be formed on an uppermost one of the second insulation pattern 315 and the third insulating interlayer pattern 330. The third insulating interlayer pattern 330 and the fourth insulating interlayer 340 may include an oxide, e.g., silicon oxide.

The gate electrodes may include a first gate electrode 503, a second gate electrode 505, and a third gate electrode 507 sequentially stacked in the first direction. The first gate electrode 503 may serve as a ground selection line (GSL), the second gate electrode 505 may serve as a word line, and the third gate electrode 507 may serve as a string selection line (SSL). At least one of the first, second and third gate electrodes 503, 505 and 507 may be formed at one level or at a plurality of levels. One or more than one dummy word lines (not shown) may be further formed between the first and second gate electrodes 503 and 505, and/or between the second and third gate electrodes 505 and 507.

In example embodiments, the first gate electrode 505 may be formed at a lowermost level from the upper surface of the substrate 100, the third gate electrode 507 may be formed at an uppermost level and a closest level to the uppermost level thereunder from the upper surface of the substrate 100, and the second gate electrode 505 may be formed at even numbers of levels between the first and third gate electrodes 505 and 507. The first gate electrode 503 may be close to a semiconductor pattern 360 under the second structure, and at least one of the second and third gate electrodes 505 and 507 may be close to the channel 410 at a central portion of the second structure.

The first gate electrode 503 may include a first gate pattern 493, and a first gate barrier pattern 483 covering a top, a bottom, and a portion of a sidewall of the first gate conductive pattern 493. The second gate electrode 505 may include a second gate conductive pattern 495, and a second gate barrier pattern 485 covering a top, a bottom, and a portion of a sidewall of the second gate conductive pattern 495. The third gate electrode 507 may include a third gate conductive pattern 497, and a third gate barrier pattern 487 covering a top, a bottom, and a portion of a sidewall of the third gate conductive pattern 497.

At least one of the first to third gate conductive patterns 493, 495 and 497 may include a metal having a low electrical resistance, e.g., tungsten, titanium, tantalum, platinum, etc. At least one of the first to third gate barrier patterns 483, 485 and 487 may include a metal nitride, e.g., titanium nitride, tantalum nitride, etc. Alternatively, at least one of the first to third gate barrier patterns 483, 485 and 487 may have a first pattern including a metal and a second pattern including a metal nitride.

A top, a bottom and a sidewall of at least one of the first to third gate electrodes 503, 505 and 507 may be covered by a second blocking layer 470. The second blocking layer 470 may further cover sidewalls of the second insulation pattern 315 and the fourth and fifth insulating interlayers 340 and 435.

The second blocking layer 470 may include a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The second insulation patterns 315 may include silicon oxide, e.g., PE-TEOS, HDP oxide, PEOX, etc. One of the gate electrodes and one of the second insulation patterns 315 sequentially stacked on the base layer 240 in the first direction on the second region II of the substrate 100 may form a step of the staircase shaped structure.

At least one of the second structures may include a first structure having the semiconductor pattern 360, a charge storage structure 400, the channel 410 and a filling pattern 420, and a second capping pattern 430 on the first structure.

The semiconductor pattern 360 may include, e.g., single crystalline silicon or single crystalline germanium according to the material of the base layer 240, and may be doped with impurities. In example embodiments, the semiconductor pattern 360 may have a pillar shape. In example embodiments, the semiconductor pattern 360 may be formed such that an upper surface of the semiconductor pattern 360 may be located between a top and a bottom of one of the second insulation patterns 315 at a second level from an upper surface of the base layer 240 in the first direction. The semiconductor pattern 360 may serve as a channel as the overlying channel 410, and thus may be referred to as a lower channel.

The channel 410 may extend in the first direction on a central upper surface of the semiconductor pattern 360, and may have a cup-like shape. The charge storage structure 400 may extend in the first direction on an edge upper surface of the semiconductor pattern 360 to cover an outer sidewall of the channel 410, and may have a cup-like shape of which a central bottom portion is opened. The filling pattern 420 may have a pillar shape filling an inner space formed by the cup-like shaped channel 410.

The charge storage structure 400 may include first blocking pattern 370, a charge storage pattern 380, and a tunnel insulation pattern 390.

The channel 410 may include polysilicon doped with impurities or undoped polysilicon, or single crystalline silicon. The first blocking pattern 370 may include an oxide, e.g., silicon oxide, the charge storage pattern 380 may include a nitride, e.g., silicon nitride, and the tunnel insulation pattern 390 may include an oxide, e.g., silicon oxide.

The second capping pattern 430 may include polysilicon doped with impurities or undoped polysilicon, or single crystalline silicon. The second capping pattern 430 may extend through the uppermost one of the second insulation pattern 315 and the fourth insulating interlayer 340.

The first CSL 530 may contact an upper surface of a fifth impurity region 245 on the base layer 240, the second CSL 542 may contact the upper surface of the fifth impurity region 245 and an upper surface of the fifth contact plug 260, and the sixth to eighth contact plugs 544, 546 and 548 may contact the upper surface of the fifth contact plug 260. The second CSL 542 and the sixth to eighth contact plugs 544, 546 and 548 may also contact an upper surface of the first insulation pattern 250 surrounding the fifth contact plug 260.

The first and second CSLs 530 and 542, and the sixth to eighth contact plugs 544, 546 and 548 may include substantially the same material, e.g., a metal, a metal nitride, and/or a metal silicide, and may have substantially the same length in the first direction. Thus, bottoms and tops of the first and second CSLs 530 and 542 and the sixth to eighth contact plugs 544, 546 and 548 may be substantially coplanar with each other.

In example embodiments, the first CSL 530 may extend in the second direction between the memory cell blocks, and thus a plurality of first CSLs 530 may be formed in the third direction. That is, two channel groups each including four channel columns may be formed between neighboring ones of the first CSLs 530 in the third direction.

In example embodiments, the second CSL 542 and the sixth to eighth contact plugs 544, 546 and 548 may be spaced apart from one another in the second direction between neighboring ones of the channel groups in the third direction in each memory cell block. That is, the second CSL 542 and the sixth to eighth contact plugs 544, 546 and 548 may be in the second direction at a central portion of each memory cell block in the third direction.

In example embodiments, the second CSL 542 and the sixth and seventh contact plugs 544 and 546 may be formed on the first region I of the substrate 100, and the eighth contact plug 548 may be formed on the second region II of the substrate 100. The second CSL 542 may extend in the second direction at a central portion of the first region I of the substrate 100 in the second direction, the seventh contact plug 546 may be formed on an edge portion of the first region I of the substrate 100 in the second direction, i.e., on an edge portion of the first region I of the substrate 100 adjacent the second region II of the substrate 100, and the sixth contact plug 544 may be formed between the second CSL 542 and the seventh contact plug 546. A plurality of eighth contact plugs 548 may be spaced apart from another in the second direction on the second region II of the substrate 100.

The second CSL 542 and the sixth and seventh contact plugs 544 and 546 may extend through the gate electrodes, the second insulation patterns 315, the fourth insulating interlayer 340 and the fifth insulating interlayer 435, and the eighth contact plug 548 may extend through the gate electrodes, the second insulation patterns 315, the third insulating interlayer pattern 330, and the fourth and fifth insulating interlayers 340 and 435.

The fifth insulating interlayer 435 may include an oxide, e.g., silicon oxide.

A sidewall of the first CSL 530 may be covered by a second spacer 520, and the second CSL 542 and the sixth to eighth contact plugs 544, 546 and 548 may be covered by a third spacer 530. The second and third spacers 520 and 530 may include an oxide, e.g., silicon oxide.

A sixth insulating interlayer 550 may be formed on the fifth insulating interlayer 435, the first and second CSLs 530 and 542, the sixth to eighth contact plugs 544, 546 and 548, the second and third spacers 510 and 520, and the second blocking layer 470. The ninth contact plug 560 may extend through the fifth and sixth insulating interlayers 435 and 550 to contact an upper surface of the second capping pattern 430, the tenth and eleventh contact plugs 561 and 562 may extend through sixth insulating interlayer 550 to contact upper surfaces of the first and second CSLs 530 and 542, and the twelfth to fourteenth contact plugs 564, 566 and 568 may contact upper surfaces of the sixth to eighth contact plugs 544, 546 and 548, respectively.

The sixth insulating interlayer 550 may include an oxide, e.g., silicon oxide, and thus may be merged with the underlying fifth insulating interlayer 435. The ninth to fourteenth contact plugs 560, 561, 562, 564, 566 and 568 may include a metal, e.g., tungsten, titanium, tantalum, copper, aluminum, etc., and/or a metal nitride, e.g., titanium nitride, tantalum nitride, tungsten nitride, etc.

The fifteenth and sixteenth contact plugs 570 and 575 may extend through the third to sixth insulating interlayers 330, 340, 435 and 550, the second insulation pattern 315, the second blocking layer 470, and the gate barrier patterns 483, 485 and 487 to contact upper surfaces of the gate conductive patterns 493, 495 and 497.

The fifteenth contact plug 570 may be formed on an edge portion of the first region I of the substrate 100 adjacent the second region II of the substrate 100 in the second direction in which the staircase shaped pads are formed, and the sixteenth contact plug 575 may be formed on each staircase shaped pad on the second region II of the substrate 100. That is, the sixteenth contact plug 575 may be formed on each pad not covered by underlying pads.

In example embodiments, the sixteenth contact plugs 575 may be spaced apart from another in the second direction by a constant distance. In one an example embodiment, the sixteenth contact plugs 575 may be linearly in each memory cell block, in a plan view. Alternatively, the sixteenth contact plugs 575 may be in a zigzag layout in the second direction in each memory cell block, in a plan view.

The fifteenth to sixteenth contact plugs 570 and 575 may include a metal, e.g., tungsten, titanium, tantalum, copper, aluminum, etc., and/or a metal nitride, e.g., titanium nitride, tantalum nitride, tungsten nitride, etc.

A seventh insulating interlayer 580 may be formed on the sixth insulating interlayer 550, the ninth to sixteenth contact plugs 560, 561, 562, 564, 566, 568, 570 and 575, and the bit line 600, the dummy bit lines 602 and 603, the signal line 604, and the ninth to eleventh wirings 606, 608 and 609 may extend through the seventh insulating interlayer 580.

The bit line 600, the dummy bit lines 602 and 603, the signal line 604, and the ninth to eleventh wirings 606, 608 and 609 may include a metal, e.g., tungsten, titanium, tantalum, copper, aluminum, etc., and/or a metal nitride, e.g., titanium nitride, tantalum nitride, tungsten nitride, etc.

The bit line 600 may contact an upper surface of the underlying ninth contact plug 560, the second dummy bit line 603 may contact an upper surface of the underlying eleventh contact plug 562, the signal line 604 may contact an upper surface of the underlying twelfth contact plug 564, and the ninth to eleventh wirings 606, 608 and 609 may contact upper surfaces of the underlying tenth, thirteenth and fourteenth contact plugs 561, 566 and 568, respectively. The ninth wiring 606 may contact an upper surface of the underlying fifteenth contact plug 570, and the tenth and eleventh wirings 608 and 609 may contact an upper surface of the underlying sixteenth contact plug 575.

In example embodiments, at least one of the bit line 600 and the first dummy bit line 602 may extend in the third direction, and a plurality of bit lines 600 and a plurality of first dummy bit lines 602 may be formed in the second direction. At least one of the second dummy bit line 603 and the signal line 604 may include a plurality of extension portions each extending in the third direction, and a connection portion for connecting the extension portions to each other. The connection portion of the second dummy bit line 603 may contact an upper surface of the underlying eleventh contact plug 562, and the connection portion of the signal line 604 may contact an upper surface of the underlying twelfth contact plug 564.

In example embodiments, the ninth wiring 606 may include a first extension portion extending in the second direction, and a second extension portion extending in the third direction and being connected to the first extension portion. The tenth wiring 608 may include first and third extension portions each extending in the second direction, and a second extension portion extending in the third direction and being connected to the first and third extension portions. The eleventh wiring 609 may extend in the third direction, or may include first and third extension portions each extending in the second direction, and a second extension portion extending in the third direction and being connected to the first and third extension portions.

The second dummy bit line 603, the signal line 604, the ninth to eleventh wirings 606, 608 and 609 may be connected to other upper wirings.

In the vertical memory device, the lower circuit pattern may be electrically connected to the bit line 600, the first and second dummy bit lines 602 and 603, the signal line 604, and the ninth to eleventh wirings 606, 608 and 609, via the fifth contact plug 260.

For example, the first transistor may be electrically connected to the second dummy bit line 603 via the fifth contact plug 260, the second CSL 542 and the eleventh contact plug 562, and the second dummy bit line 603 may be electrically connected to an overlying power line.

Alternatively, the first transistor may be electrically connected to the signal line 604 via the fifth contact plug 260, the sixth contact plug 544 and the twelfth contact plug 564. Alternatively, the first transistor may be electrically connected to tenth wiring 608 via the fifth contact plug 260, the seventh contact plug 546 and the thirteenth contact plug 566. Alternatively, the first transistor may be electrically connected to eleventh wiring 609 via the fifth contact plug 260, the eighth contact plug 548 and the fourteenth contact plug 568. The tenth and eleventh wirings 608 and 609 may be electrically connected to gate electrodes, respectively, via the sixth contact plug 544.

The fifth contact plug 260 may be formed under and overlap the second CSL 542 and the sixth to eighth contact plugs 544, 546 and 548 in the first direction, and thus no additional area for forming the fifth contact plug 260 may be needed or desired. Accordingly, the vertical memory device may have a reduced size.

FIGS. 8 to 29 are cross-sectional views illustrating stages of a method of manufacturing a vertical memory device. Particularly, FIGS. 8, 13, 16, 19, 24 and 26 are plan views, and FIGS. 9-12, 14-15, 17-18, 20-23, 25 and 27-29 are cross-sectional views.

Figure 29:
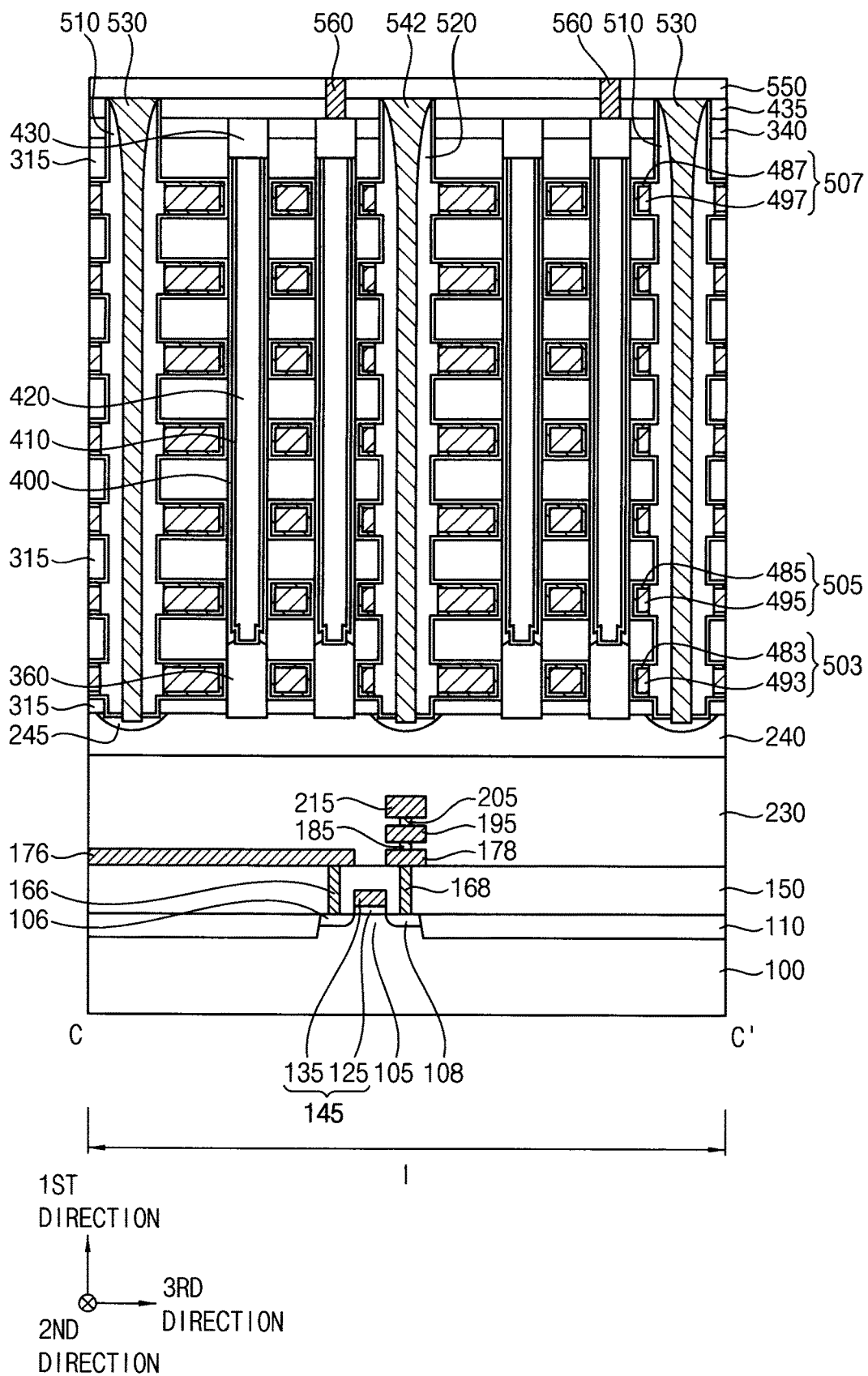

FIGS. 9-12, 17-18, 20-22, 25 and 27 are cross-sectional views taken along lines A-A' of corresponding plan views, respectively, FIGS. 14-15, 23 and 28 are cross-sectional views taken along lines B-B' of corresponding plan views, respectively, and FIG. 29 is a cross-sectional view taken along a line C-C' of a corresponding plan view.

Figure 8:
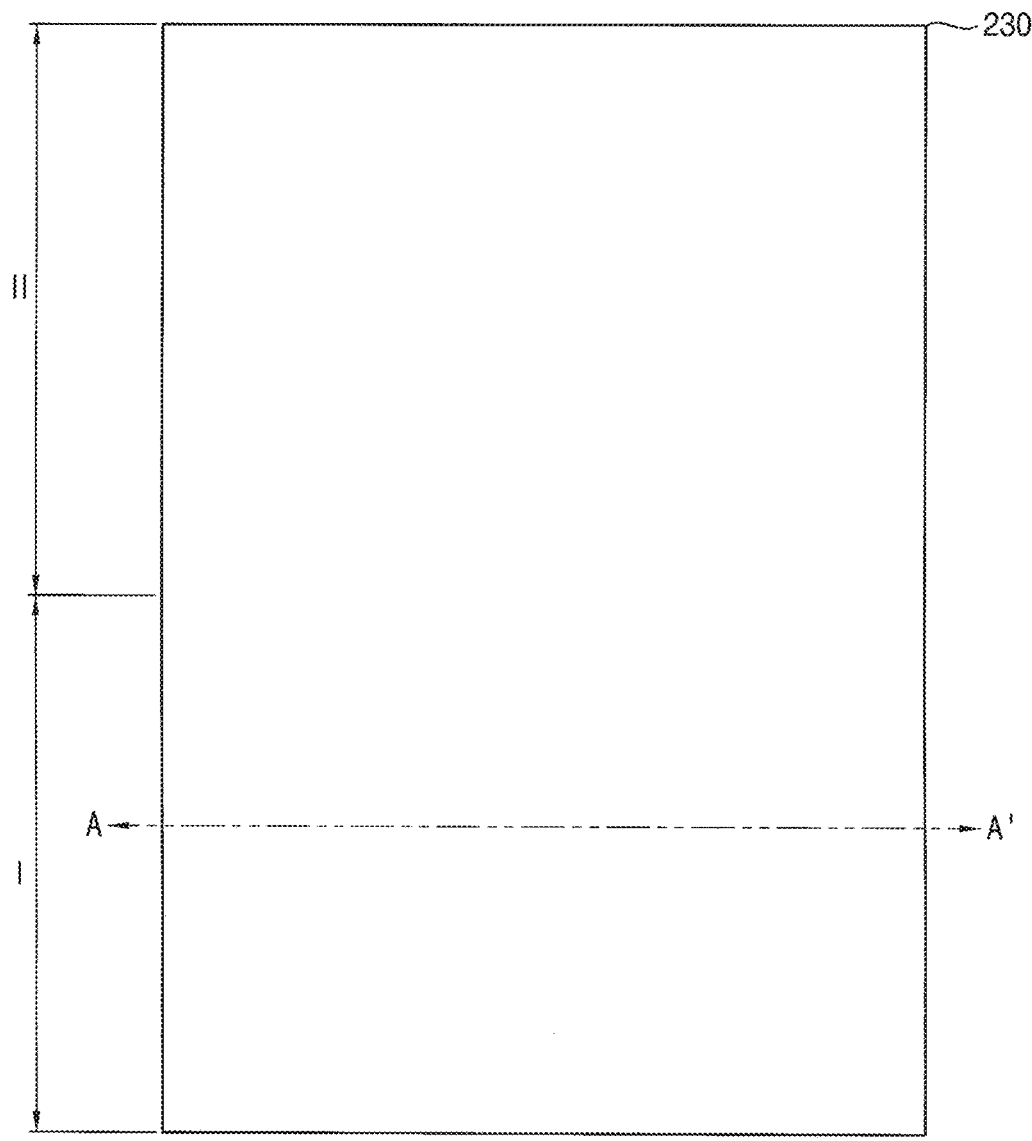
FIGS. 8 to 29 are cross-sectional views illustrating stages of a method of manufacturing a vertical memory device.
Figure 9:
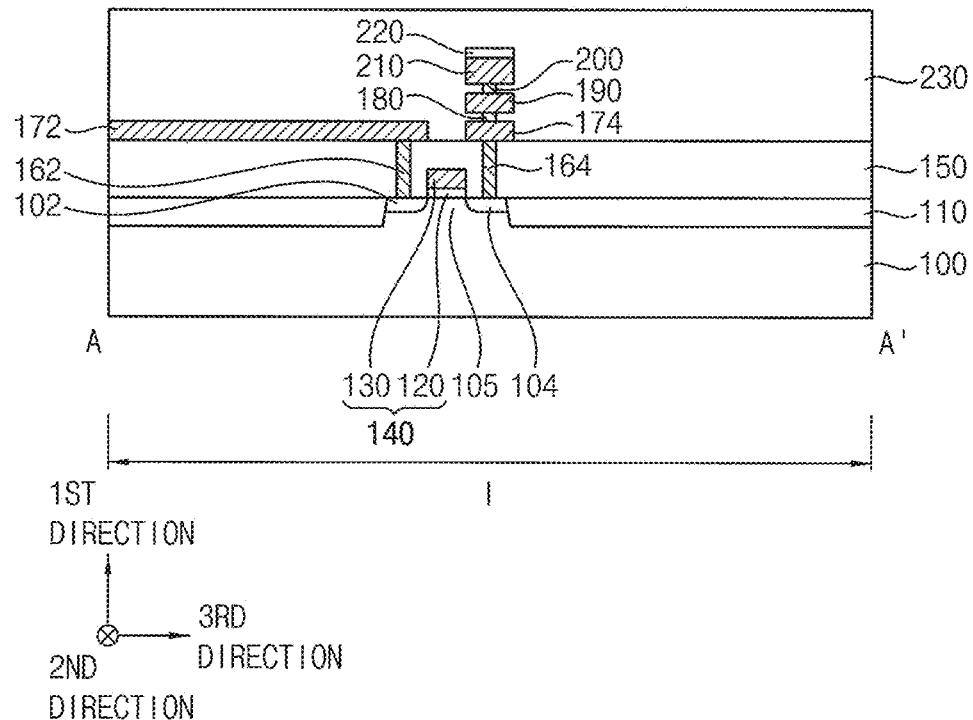

Referring to FIGS. 8 and 9, a circuit pattern may be formed on the substrate 100, and first and second insulating interlayers 150 and 230 may be sequentially formed on the substrate 100 to cover the circuit pattern.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate, or a GOI substrate.

In example embodiments, the substrate 100 may include first and second regions I and II. The first region I may serve as a cell array region in which a memory cell array may be formed, and the second region II may serve as a pad region in which gate electrode pads may be formed. The cell array region together with the pad region may be referred to as a memory cell region.

The substrate 100 may be divided into a field region on which an isolation pattern 110 is formed, and an active region 105 on which no isolation pattern is formed. The isolation pattern 110 may be formed by a shallow trench isolation (STI) process, and may be formed of or including an oxide, e.g., silicon oxide.

In example embodiments, the vertical memory device may have a COP structure. That is, a circuit pattern may be formed under the memory cells, and thus a circuit pattern region in which the circuit pattern may be formed and the memory cell region may be vertical stacked.

Figure 14:
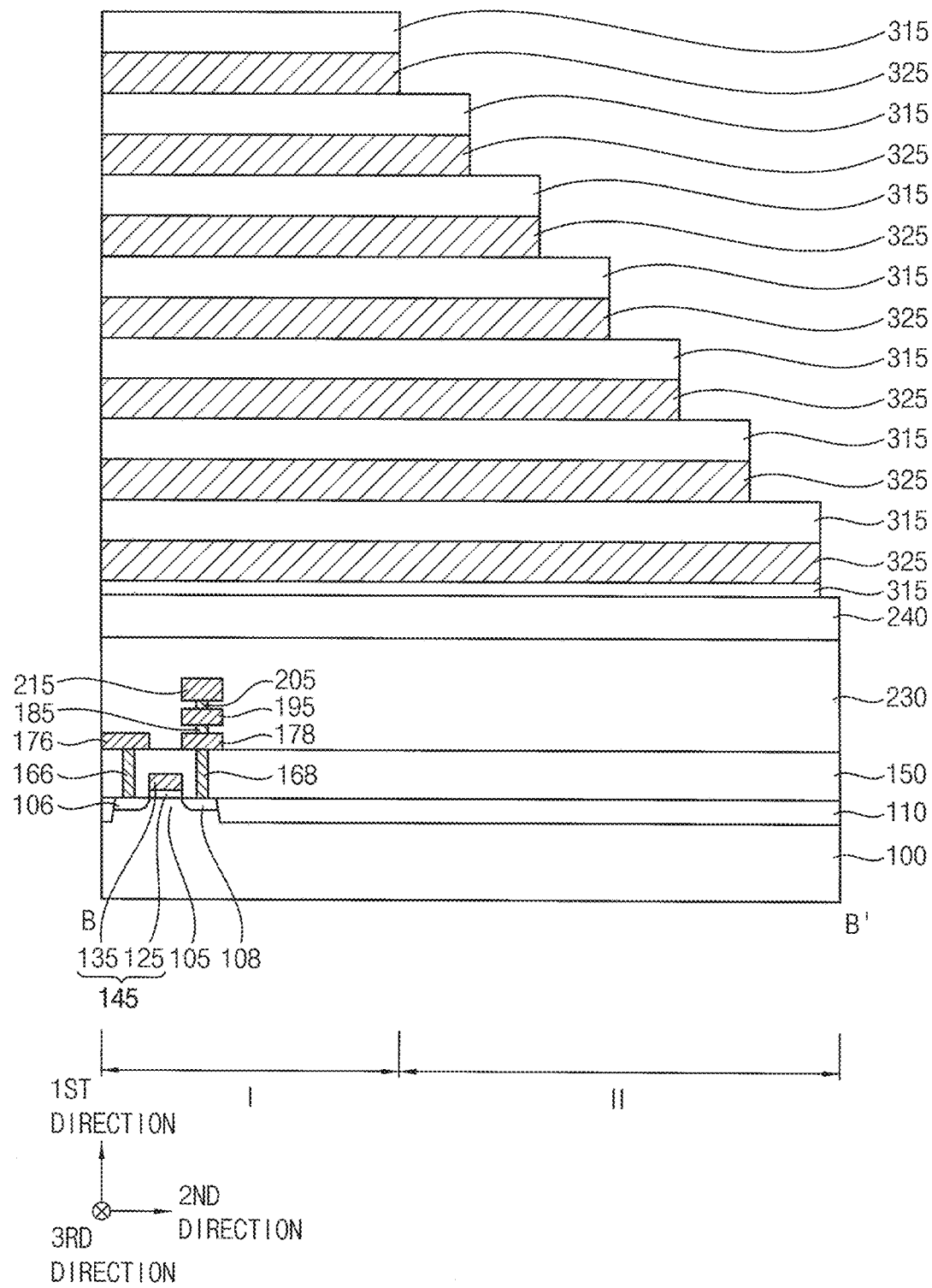

The circuit pattern may include transistors, contact plugs, wirings, vias, etc. FIG. 9 shows a first transistor, first and second contact plugs 162 and 164, first and second wirings 172 and 174, first and second vias 180 and 200, and third and fourth wirings 190 and 210, and FIG. 14 shows a second transistor, third and fourth contact plugs 166 and 168, fifth and sixth wirings 176 and 178, third and fourth vias 185 and 205, and seventh and eighth wirings 195 and 215. However, inventive concepts may not be limited thereto, and more or less numbers of the transistors, the contact plugs, the wirings, and the vias may be formed.

The first transistor may include a first lower gate structure 140 on the substrate 100, and first and second impurity regions 102 and 104 at upper portions of the active region 105 of the substrate 100 adjacent thereto.

The first lower gate structure 140 may be formed to include a first lower gate insulation pattern 120 and a first lower gate electrode 130 sequentially stacked on the substrate 100. The first lower gate insulation pattern 120 may be formed of or include an oxide, e.g., silicon oxide, and the first lower gate electrode 130 may be formed of, e.g., a metal, a metal nitride, a metal silicide, doped polysilicon, etc. At least one of the first to fourth impurity regions 102, 104, 106 and 108 may be doped with n-type or p-type impurities.

The first insulating interlayer 150 may be formed of or include an oxide, e.g., silicon oxide, and at least one of the first and second contact plugs 162 and 164 may be formed of or include a metal, a metal nitride, or doped polysilicon. In an example embodiment, at least one of the first and second contact plugs 162 and 164 may be formed to include a metal pattern (not shown) and a barrier pattern (not shown) covering a lower surface and a sidewall of the metal pattern.

The first and second wirings 172 and 174 may be formed on the first insulating interlayer 150 to contact upper surfaces of the first and second contact plugs 162 and 164, respectively. A first via 180, a third wiring 190, a second via 200 and a fourth wiring 210 may be sequentially formed on the second wiring 174. At least one of the first to fourth wirings 172, 174, 190 and 210 and at least one of the first and second vias 180 and 200 may be formed of or include a metal, a metal nitride or doped polysilicon. In an example embodiment, at least one of the first to fourth wirings 172, 174, 190 and 210 and at least one of the first and second vias 180 and 200 may be formed to include a metal pattern (not shown) and a barrier pattern (not shown) covering a lower surface and a sidewall of the metal pattern.

FIG. 9 shows wirings 172, 174, 190 and 210 are formed in three levels on the first insulating interlayer 150, however, inventive concepts may not be limited thereto. Thus, the wirings may be formed in more or less numbers of levels.

In example embodiments, at least one of the first to fourth wirings 172, 174, 190 and 210 and at least one of the first and second vias 180 and 200 may be formed by a damascene process. Alternatively, at least one of the first to fourth wirings 172, 174, 190 and 210 and at least one of the first and second vias 180 and 200 may be formed by a photolithography process.

The second insulating interlayer 230 may be formed on the first insulating interlayer 150 to cover the first to fourth wirings 172, 174, 190 and 210 and the first and second vias 180 and 200. The second insulating interlayer 230 may be formed of or include an oxide, e.g., silicon oxide, and thus may be merged with the underlying first insulating interlayer 150.

In example embodiments, a first capping pattern 220 may be formed on the fourth wiring 210. The first capping pattern 220 may be formed of or include polysilicon doped with n-type impurities, e.g., phosphorus, arsenic, etc. When the underlying fourth wiring 210 includes a metal, the first capping pattern 220 may hinder or prevent the metal of the fourth wiring 210 from being diffused to neighboring structures.

Referring to FIG. 14, the second transistor may include a second lower gate structure 145 on the substrate 100, and third and fourth impurity regions 106 and 108 at upper portions of the active region 105 of the substrate 100 adjacent thereto. The second lower gate structure 145 may be formed to include a second lower gate insulation pattern 125 and a second lower gate electrode 135 sequentially stacked on the substrate 100. The second lower gate insulation pattern 125 and the second lower gate electrode 135 may include substantially the same materials of the first lower gate insulation pattern 120 and the first lower gate electrode 130, respectively. The third and fourth impurity regions 106 and 108 may be doped with n-type or p-type impurities.

The third and fourth contact plugs 166 and 168 may be formed through the first insulating interlayer 150 to contact the third and fourth impurity regions 106 and 108, respectively. The third and fourth contact plugs 166 and 168 may be formed of or include materials substantially the same as those of the first and second contact plugs 162 and 164, respectively.

The fifth and sixth wirings 176 and 178 may be formed on the first insulating interlayer 150 to contact upper surfaces of the third and fourth contact plugs 166 and 168, respectively. A third via 185, a seventh wiring 195, a fourth via 205, and an eighth wiring 215 may be sequentially formed on the sixth wiring 178. The fifth to eighth wirings 176, 178, 195 and 215, and the third and fourth vias 185 and 205 may be formed of or include materials substantially the same as those of the first to fourth wirings 172, 174, 190 and 210, and the first and second vias 180 and 200, respectively.

Unlike the fourth wiring 210, no capping pattern may be formed on the eighth wiring 215.

Figure 10:
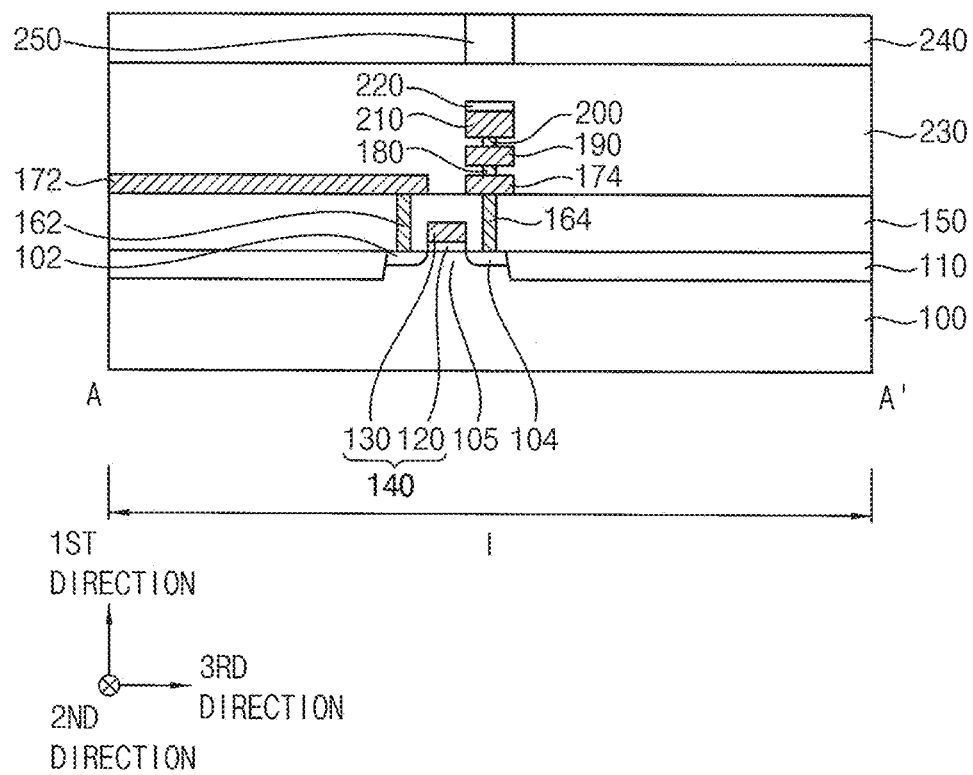

Referring to FIG. 10, a base layer 240 may be formed on the second insulating interlayer 230, and a first insulation pattern 250 may be formed through the base layer 240.

The base layer 240 may be formed by a chemical vapor deposition (CVD) process, an atomic layer deposition (ALD) process, etc. The base layer 240 may be formed to include, e.g., a polysilicon layer, or have a multi-layered structure of a polysilicon layer and a metal layer.

The first insulation pattern 250 may be formed by partially removing the base layer 240 to form a first opening (not shown) exposing an upper surface of the second insulating interlayer 230, forming a first insulation layer on the exposed upper surface of the second insulating interlayer 230 and the base layer 240 to fill the first opening, and planarizing the first insulation layer until an upper surface of the base layer 240 may be exposed.

The first insulation layer may be formed of or include an oxide, e.g., silicon oxide. In example embodiments, the planarization process may be performed by a chemical mechanical polishing (CMP) process and/or an etch back process.

In example embodiments, the first insulation pattern 250 may be formed to at least partially overlap an upper surface of the underlying first capping pattern 220 in the first direction. FIG. 10 shows only one first insulation pattern 250, however, inventive concepts may not be limited thereto, and a plurality of first insulation patterns 250 may be formed on the respective wirings on which the first capping patterns 220 are formed.

The first insulation pattern 250 may have a shape of, e.g., a rectangle, a circle, an ellipse, etc., in a plan view.

Figure 11:
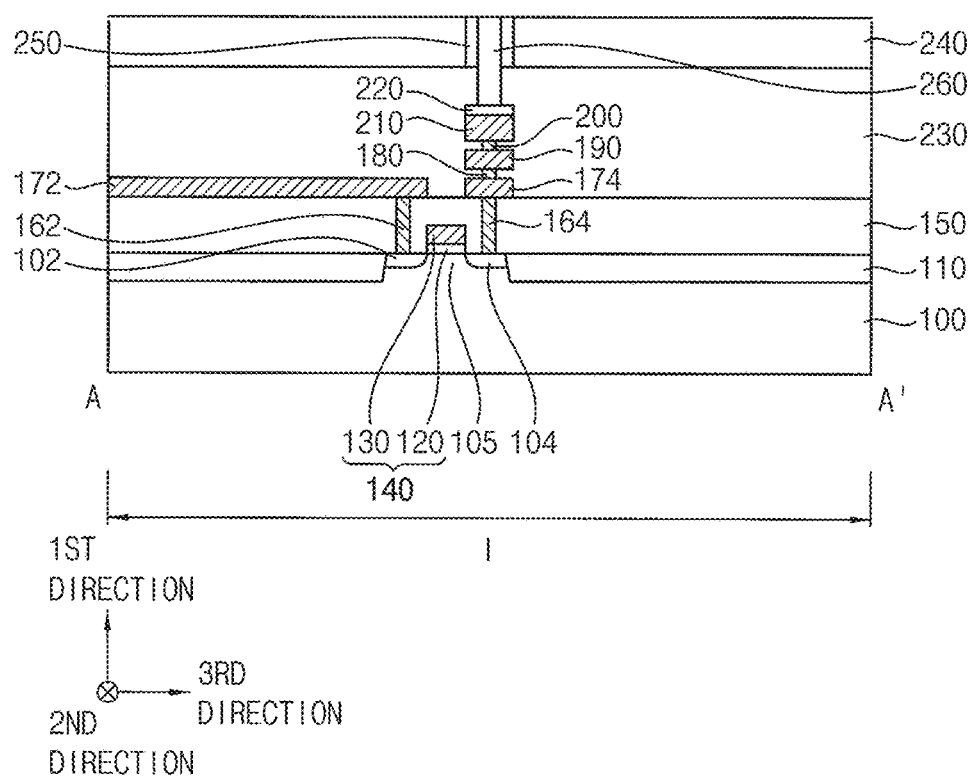

Referring to FIG. 11, a fifth contact plug 260 may be formed through the first insulation pattern 250 and an upper portion of the second insulating interlayer 230 to contact an upper surface of the first capping pattern 220.

The fifth contact plug 260 may be formed by partially removing the first insulation pattern 250 and an upper portion of the second insulating interlayer 230 to form a second opening (not shown) exposing an upper surface of the first capping pattern 220, forming a first conductive layer on the exposed upper surface of the first capping pattern 220 and the base layer 240 to fill the second opening, and planarizing the first conductive layer until the upper surface of the base layer 240 may be exposed.

The first conductive layer may be formed of or include polysilicon doped with n-type impurities, e.g., phosphorus, arsenic, etc.

The fifth contact plug 260 may be formed to have a shape of, e.g., a circuit, an ellipse, a rectangle, etc., in a plan view.

Figure 12:
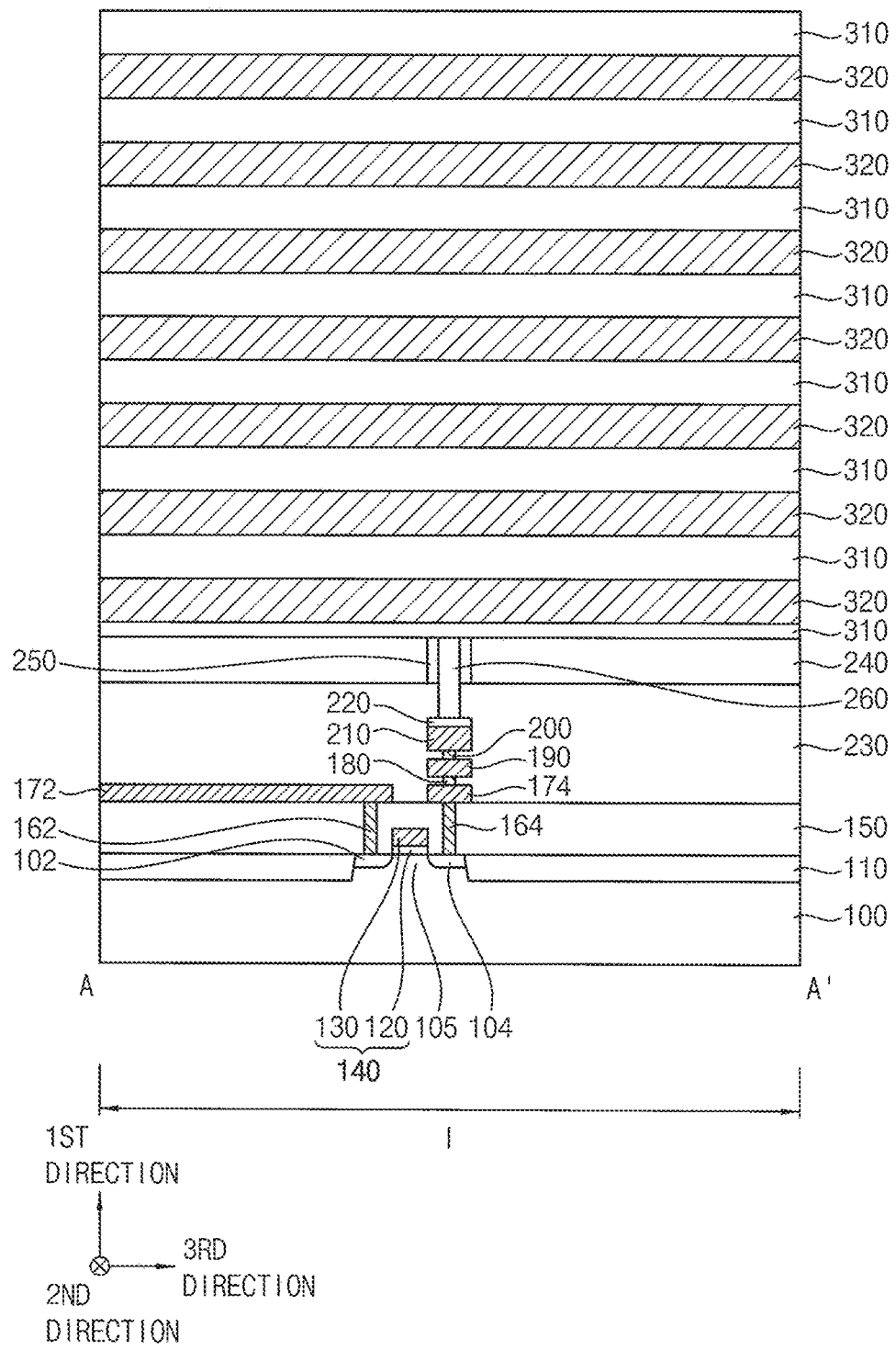

Referring to FIG. 12, a second insulation layer 310 and a sacrificial layer 320 may be alternately and repeatedly formed on the base layer 240, the first insulation pattern 250 and the fifth contact plug 260. Thus, a plurality of second insulation layers 310 and a plurality of sacrificial layers 320 may be alternately stacked on each other in the first direction. FIG. 12 shows, for purposes of illustration, eight second insulation layers 310 and seven sacrificial layers 320 alternately stacked. However, inventive concepts may not be limited to any particular number of the second insulation layers 310 and the sacrificial layers 320.

The second insulation layers 310 and the sacrificial layers 320 may be formed by a chemical vapor deposition (CVD) process, a plasma chemical vapor deposition (PECVD) process, an atomic layer deposition (ALD) process, etc.

The second insulation layers 310 may be formed of or include a silicon oxide, e.g., plasma enhanced tetraethyl-orthosilicate (PE-TEOS), high density plasma (HDP) oxide, plasma enhanced oxide (PEOX), etc. The sacrificial layers 320 may be formed of or include a material having an etching selectivity with respect to the second insulation layers 310, e.g., silicon nitride.

Figure 13:
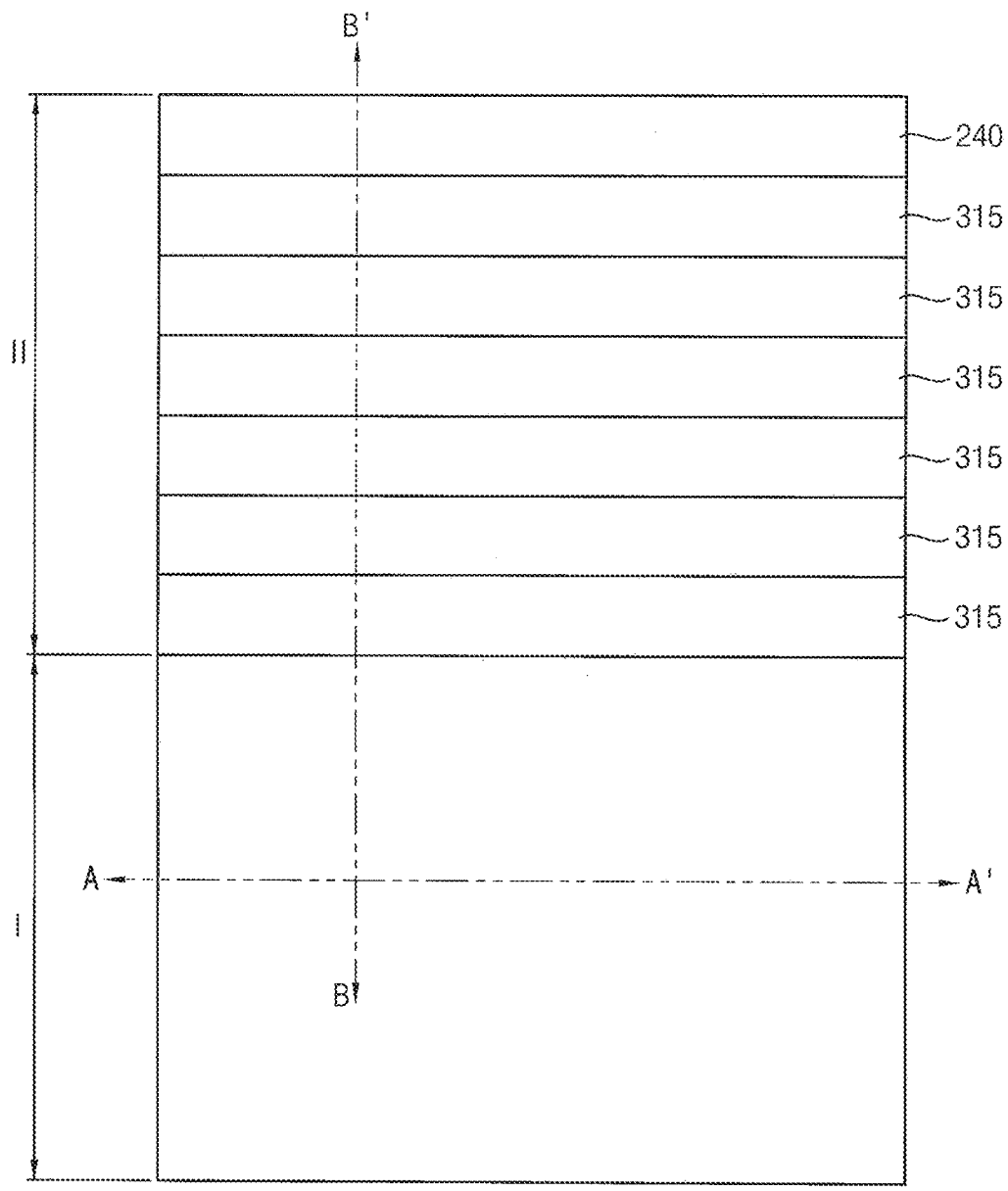

Referring to FIGS. 13 and 14, a photoresist pattern (not shown) may be formed on an uppermost one of the second insulation layers 310, and the uppermost one of the second insulation layers 310 and an uppermost one of the sacrificial layers 320 there beneath may be etched using the photoresist pattern as an etching mask. Thus, a portion of one of the second insulation layers 310 beneath the uppermost one of the sacrificial layers 320 may be exposed. After reducing the area of the photoresist pattern by a given ratio, the uppermost one of the second insulation layers 310, the uppermost one of the sacrificial layers 320, the exposed one of the second insulation layers 310, and one of the sacrificial layers 320 there beneath may be etched using the reduced photoresist pattern as an etching mask, which may be referred to as a trimming process. The trimming process may be repeatedly performed to form a staircase structure including a plurality of steps each including a sacrificial pattern 325 and a second insulation pattern 315 sequentially stacked.

In example embodiments, the steps of the staircase structure may have areas gradually decreasing from a bottom toward a top thereof.

Figure 15:
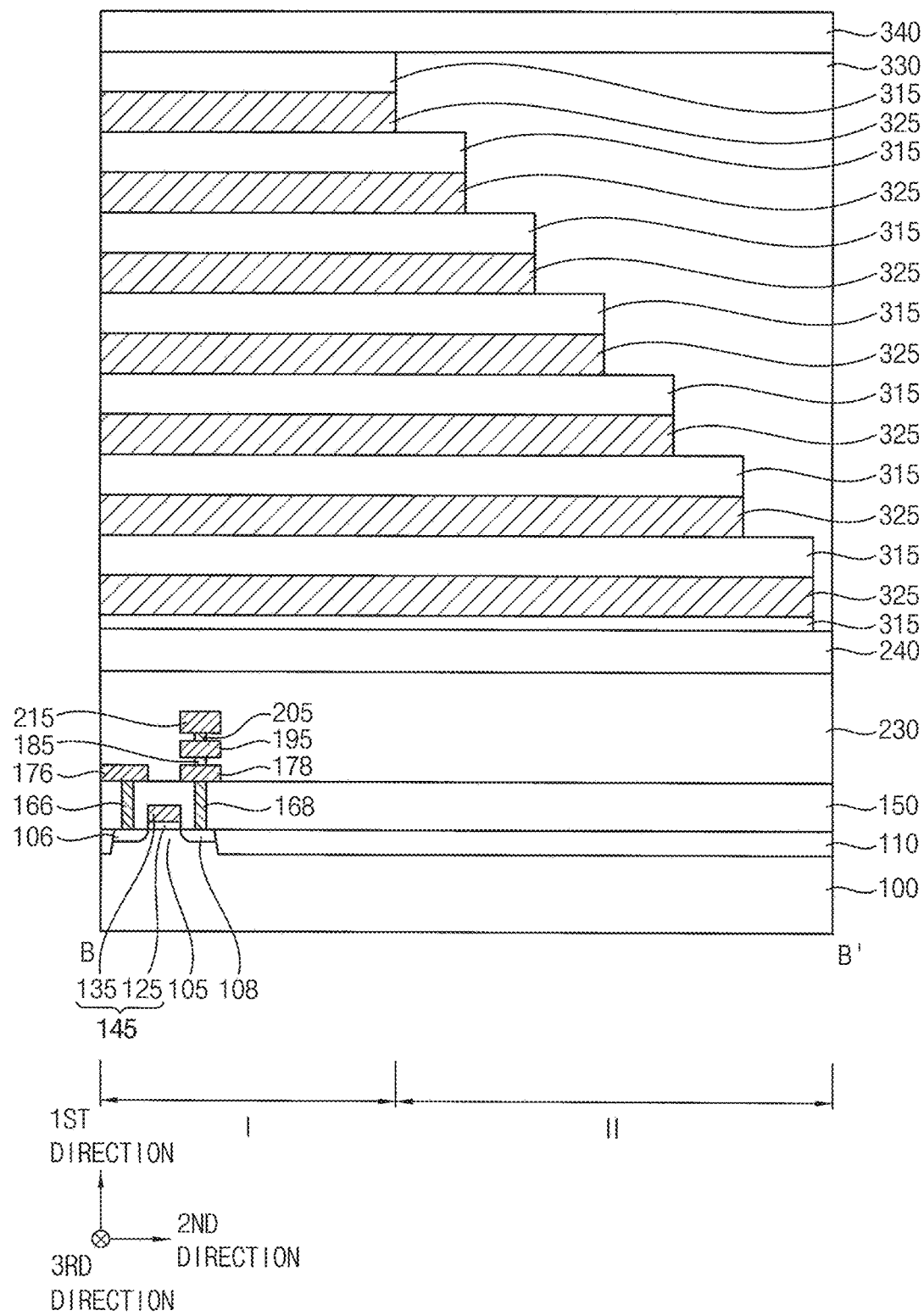

Referring to FIG. 15, a third insulating interlayer may be formed on the base layer 40 to cover the staircase structure, and the third insulating interlayer may be planarized until an upper surface of an uppermost one of the second insulation patterns 315 may be exposed to form a third insulating interlayer pattern 330 covering a sidewall of the staircase structure.

The third insulating interlayer may be formed of or include an oxide, e.g., silicon oxide, and thus may be merged with the second insulation pattern 315. The planarization process may be performed by a CMP process and/or an etch back process.

A fourth insulating interlayer 340 may be formed on upper surfaces of the staircase structure and the third insulating interlayer pattern 330.

The fourth insulating interlayer 340 may be formed of or include an oxide, e.g., silicon oxide, and thus may be merged with the third insulating interlayer pattern 330 and/or the uppermost one of the second insulation patterns 315.

Figure 16:
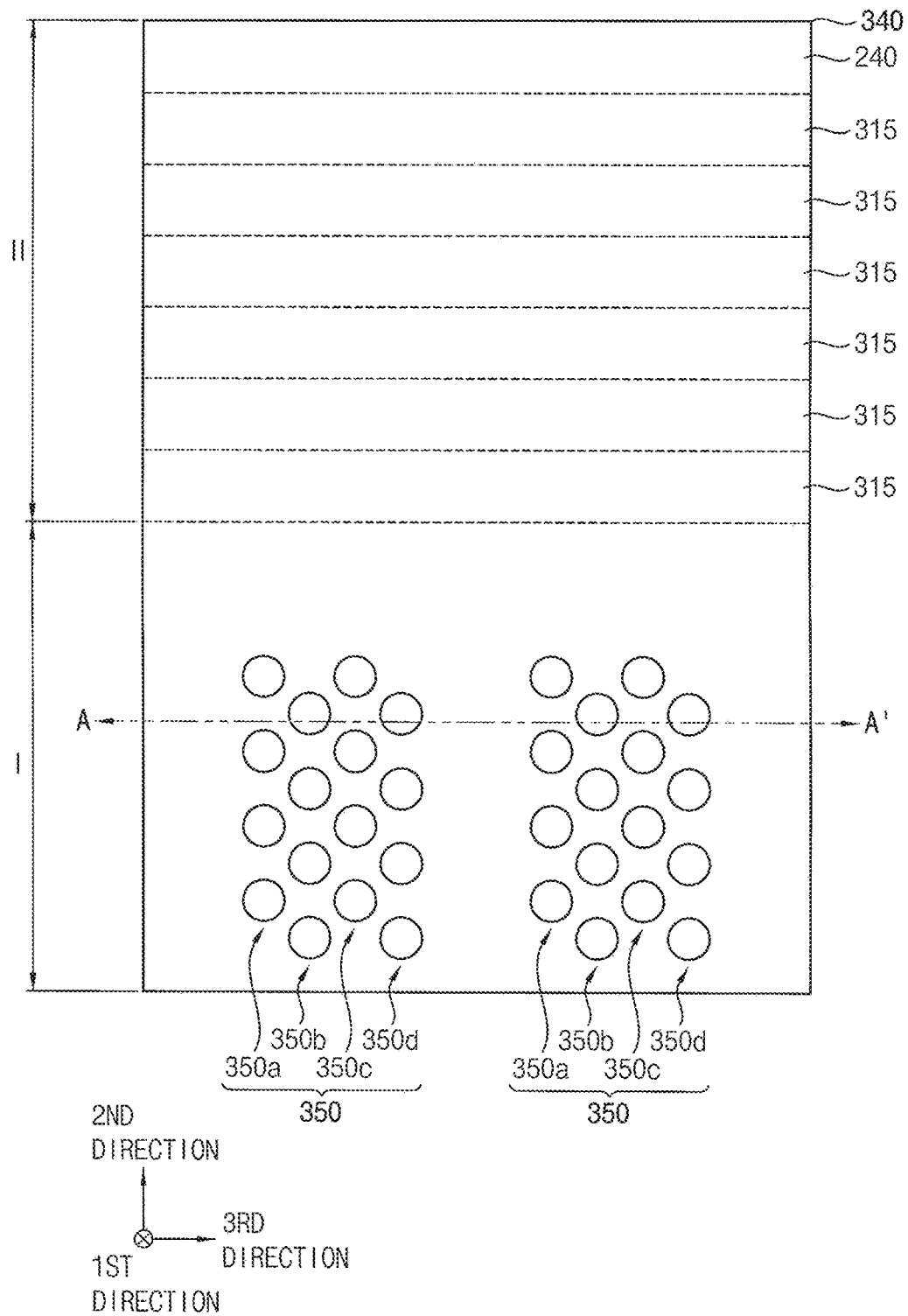
Figure 17:
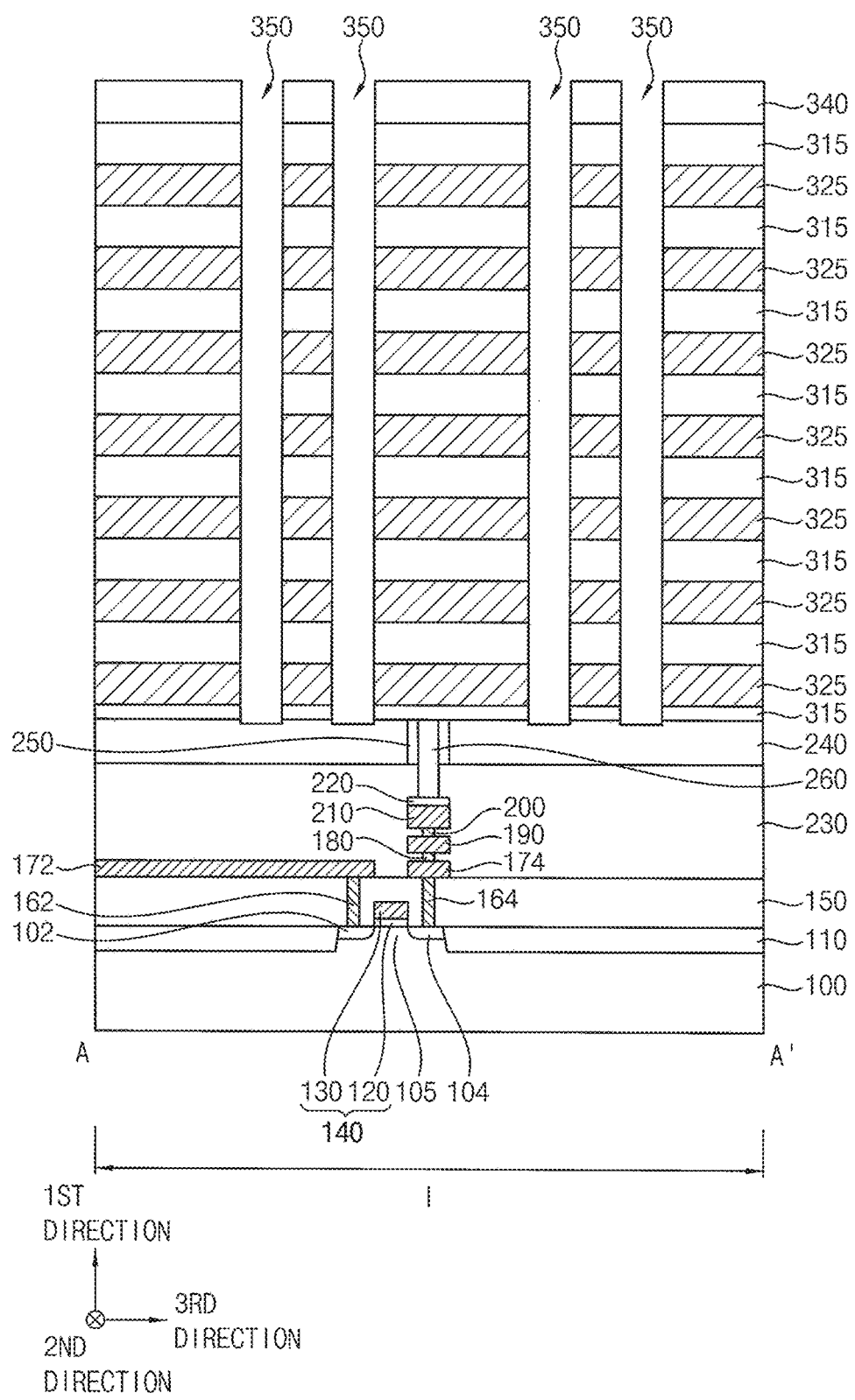

Referring to FIGS. 16 and 17, a first mask (not shown) may be formed on the fourth insulating interlayer 340, and the fourth insulating interlayer 340, the second insulation patterns 315 and the sacrificial patterns 325 may be etched using the first mask as an etching mask to form a channel hole 350 there through exposing an upper surface of the base layer 240.

A plurality of channel holes 350 may be formed in at least one of the second and third directions to define a channel hole array. In example embodiments, the channel hole array may include a first channel hole column 350a including a plurality of first channel holes
in the second direction, and a second channel hole column 350b including a plurality of second channel holes in the second direction, which may be spaced apart from the first channel hole column 350a in the third direction. The first channel holes may be at acute angles from the second channel holes with the second direction or the third direction. Thus, the first and second channel holes may be arranged in a zigzag layout in the second direction so as to be densely formed in a unit area.

The first and second channel hole columns 350a and 350b may be alternately and repeatedly in the third direction. In example embodiments, the first and second channel hole columns 350a and 350b may be in the third direction twice to form a channel hole group, and two channel hole groups spaced apart from another in the third direction may form a channel hole block.

Hereinafter, four channel hole columns in each channel hole group may be referred to as first, second, third and fourth channel hole columns 350a, 350b, 350c and 350d in this order. That is, FIG. 16 shows one channel block including two channel hole groups spaced apart from another in the third direction, and each channel hole group includes the first, second, third and fourth channel hole columns 350a, 350b, 350c and 350d in the third direction.

However, the number of the channel columns in each channel group may not be limited thereto, and the number of the channel groups in each channel block may not be limited thereto, either.

The channel hole 350 may have a shape of a circle in a plan view, however, inventive concepts may not be limited thereto. For example, the channel hole 350 may have a shape of an ellipse, a rectangle, a square, etc., in a plan view.

Figure 18A:
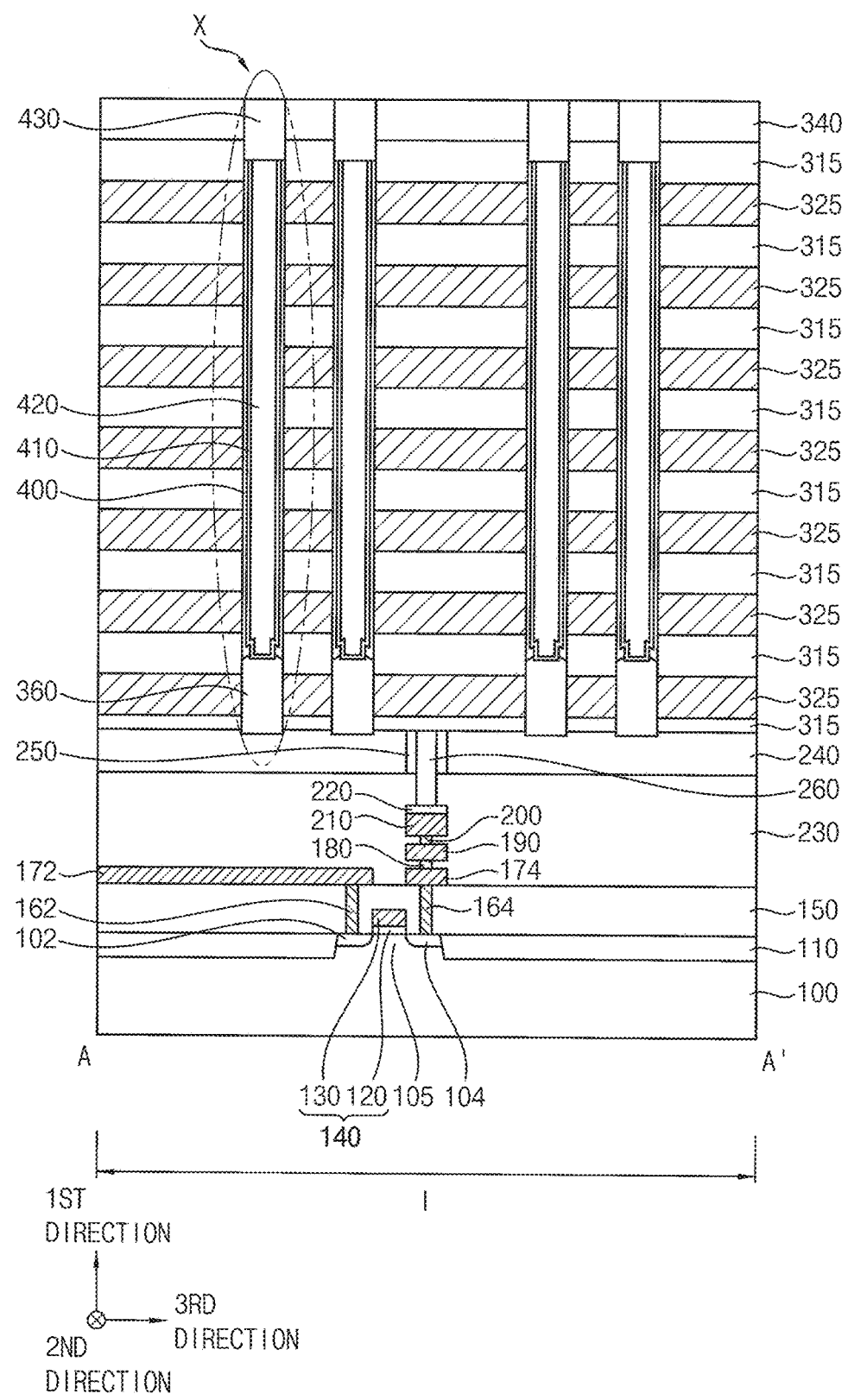
Figure 18B:
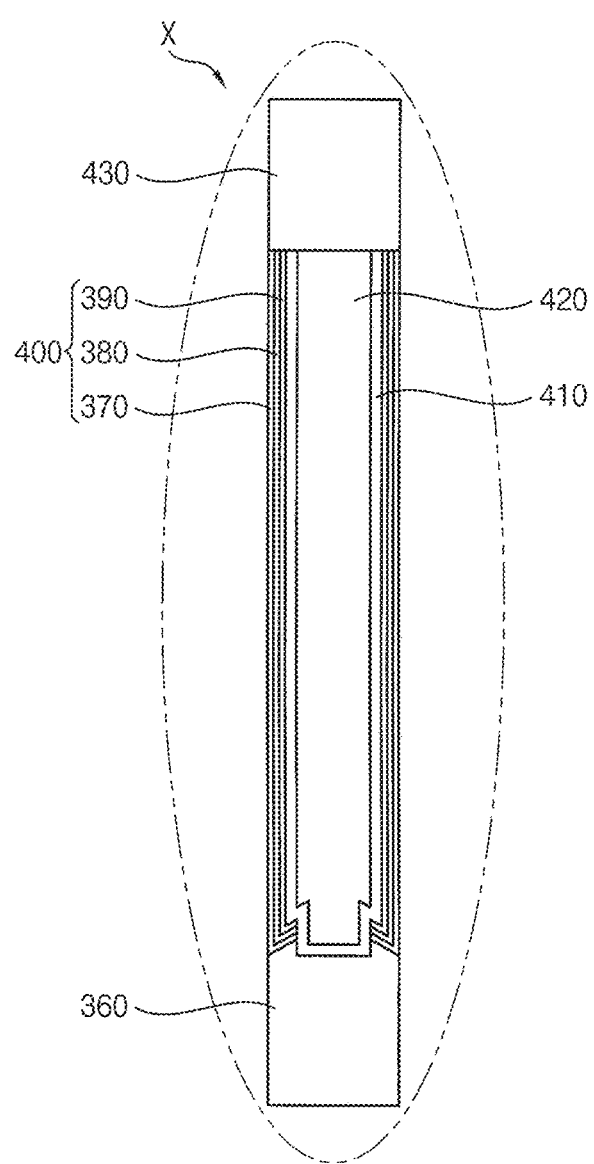

Referring to FIGS. 18A and 18B, after removing the first mask, a semiconductor pattern 360 may be formed to partially fill each channel hole 350.

Particularly, a selective epitaxial growth (SEG) process may be performed using the exposed upper surface of the base layer 240 as a seed to form the semiconductor pattern 360 partially filling at least one of the channel holes 350. Thus, the semiconductor pattern 360 may be formed to include single crystalline silicon or single crystalline germanium according to the material of the base layer 240, and in some cases, impurities may be doped there into.

Alternatively, an amorphous silicon layer may be formed to fill the channel holes 350, and a laser epitaxial growth (LEG) process or a solid phase epitaxy (SPE) process may be performed on the amorphous silicon layer to form the semiconductor pattern 360.

In example embodiments, the semiconductor pattern 360 may be formed such that an upper surface of the semiconductor pattern 360 may be located between a top and a bottom of one of the second insulation patterns 315 at a second level from an upper surface of the base layer 240 in the first direction.

The semiconductor pattern 360 may serve as a channel as a channel 410 subsequently formed, and thus may be referred to as a lower channel.

A first blocking layer, a charge storage layer, a tunnel insulation layer, and a first spacer layer (not shown) may be sequentially formed on sidewalls of the channel holes 350, an upper surface of the semiconductor pattern 360, and an upper surface of the fourth insulating interlayer 340, the first spacer layer may be anisotropically etched to form a first spacer (not shown) on sidewalls of the channel holes 350, and the tunnel insulation layer, the charge storage layer and the first blocking layer may be etched using the first spacer as an etching mask to form a tunnel insulation pattern 390, a charge storage pattern 380, and a first blocking pattern 370, respectively, on the semiconductor pattern 360 and the sidewalls of the channel holes 350. At least one of the tunnel insulation pattern 390, the charge storage pattern 380, and the first blocking pattern 370 may have a cup-like shape of which a central bottom is opened. An upper portion of the semiconductor pattern 360 may be also removed. The tunnel insulation pattern 390, the charge storage pattern 380, and the first blocking pattern 370 may form a charge storage structure 400.

The first blocking layer may be formed of or include an oxide, e.g., silicon oxide, the charge storage layer may be formed of or include a nitride, e.g., silicon nitride, the tunnel insulation layer may be formed of or include an oxide, e.g., silicon oxide, and the first spacer layer may be formed of or include a nitride, e.g., silicon nitride.

After removing the first spacer, a channel layer may be formed on the exposed semiconductor pattern 360, the tunnel insulation layer 390 and the fourth insulating interlayer 340, and a filling layer may be formed on the channel layer to fill a remaining portion of the channel hole 350.

The channel layer may be formed of or include polysilicon doped with impurities or undoped polysilicon, or amorphous silicon. When the channel layer includes amorphous silicon, a laser epitaxial growth (LEG) process or a solid phase epitaxy (SPE) process may be further performed so that the amorphous silicon may be converted into single crystalline silicon. The filling layer may be formed of or include an oxide, e.g., silicon oxide.

The filling layer and the channel layer may be planarized until an upper surface of the fourth insulating interlayer 340 may be exposed to form a filling pattern 420 filling the remaining portion of each channel hole 350, and the channel layer may be transformed into the channel 410.

Thus, the charge storage structure 400, the channel 410 and the filling pattern 420 may be sequentially stacked on the semiconductor pattern 360 in each channel hole 350. The charge storage structure 400 may have a cup-like shape of which a central bottom is opened, the channel 410 may have a cup-like shape, and the filling pattern 420 may have a pillar shape.

As the channel holes 350 may define a channel hole group including the first to fourth channel hole columns 350a, 350b, 350c and 350d, and the channel hole block including a plurality of channel hole groups and further the channel array, the channels 410 may also define a channel group, a channel block and a channel array. The channel block may serve as a unit for operation of programming and erasing in the vertical memory device.

An upper portion of a first structure including the filling pattern 420, the channel 410 and the charge storage structure 400 may be removed to form a trench (not shown), and a second capping pattern 430 may fill the trench.

Particularly, the upper portion of the first structure may be removed by an etch-back process to form the trench, a second capping layer may be formed on the first structure and the fourth insulating interlayer 340 to fill the trench, and an upper portion of the second capping layer may be planarized until the upper surface of the fourth insulating interlayer 340 may be exposed to form the second capping pattern 430. In example embodiments, the second capping layer may be formed of or include undoped or doped polysilicon or amorphous silicon, and when the second capping layer includes amorphous silicon, a crystallization process may be further performed.

The first structure, the semiconductor pattern 360 and the second capping pattern 430 in at least one of the channel holes 350 may define a second structure.

Figure 19A:
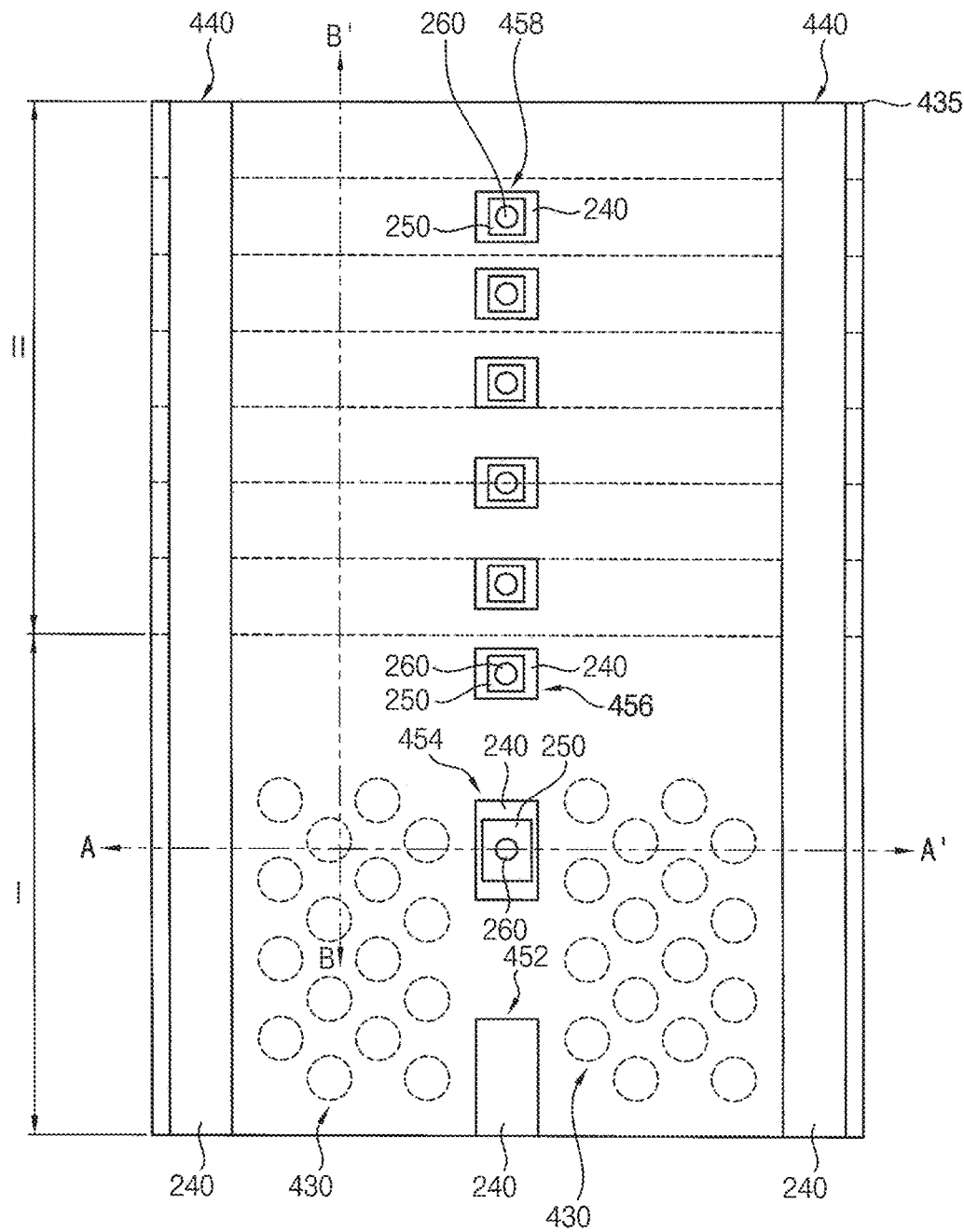
Figure 19B:
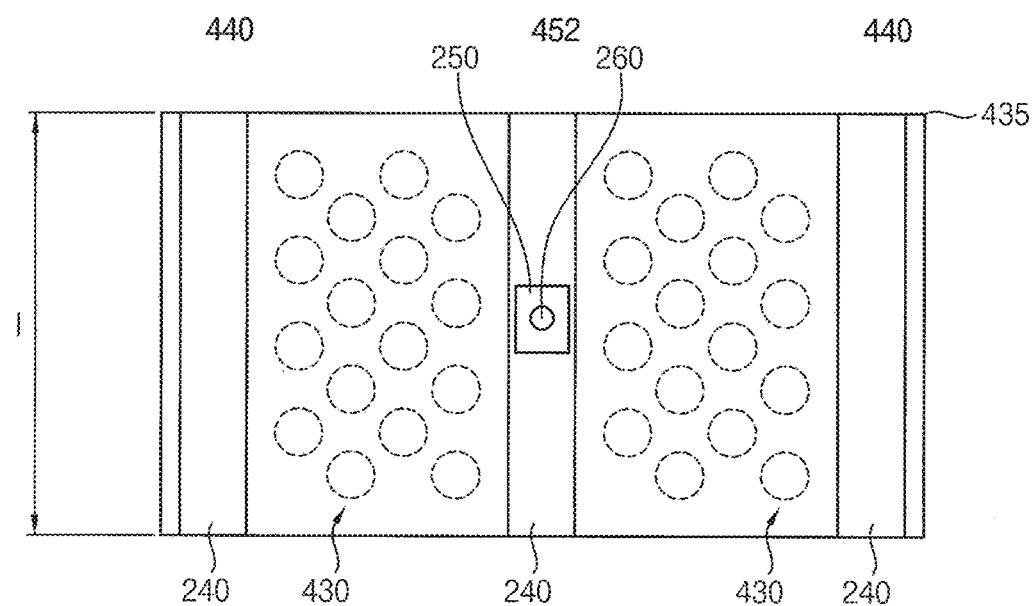
Figure 20:
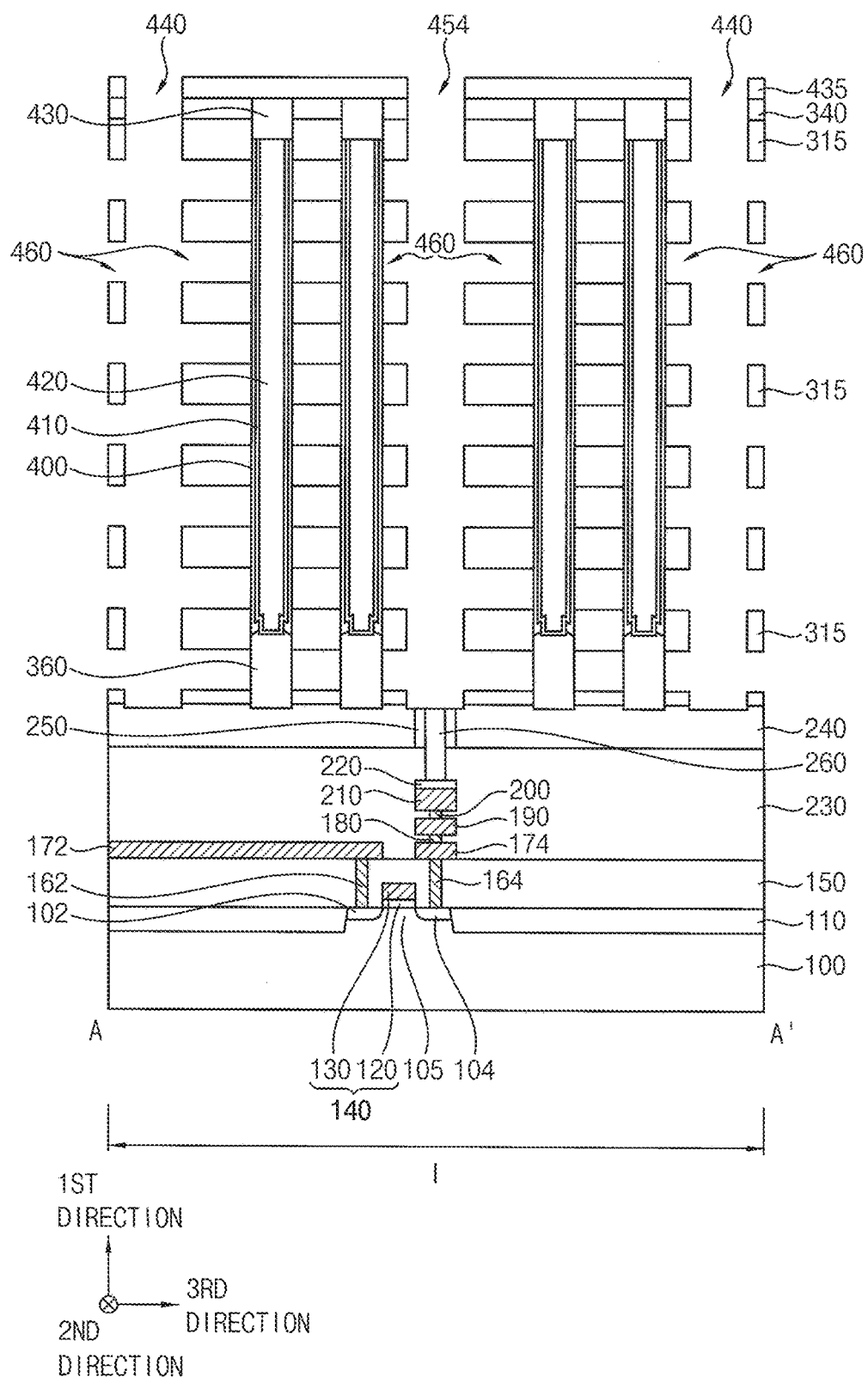

Referring to FIGS. 19A, 19B and 20, a fifth insulating interlayer 435 may be formed on the fourth insulating interlayer 340 and the second capping pattern 430. After forming a second mask (not shown) on the fifth insulating interlayer 435, third to seventh openings 440, 452, 454, 456 and 458 may be formed through the fourth and fifth insulating interlayers 340 and 435, the second insulation patterns 315 and the sacrificial patterns 325 using the second mask as an etching mask to expose an upper surface of the base layer 240. The fifth insulating interlayer 435 may be formed of or include an oxide, e.g., silicon oxide.

In example embodiments, the third opening 440 may extend in the second direction between the channel blocks, and a plurality of third openings 440 may be formed in the third direction. Thus, one channel block including two channel groups each containing four channel columns may be formed between neighboring two third openings 440, however, inventive concepts may not be limited thereto. According to the number of the channel group included in each channel block or the number of the channel columns included in each channel group, the number of the channel columns between the neighboring two second openings 440 may be changed.

In example embodiments, the fourth to seventh openings 452, 454, 456 and 458 may be formed to be spaced apart from another in the second direction between neighboring ones of the channel groups in each channel block. That is, the fourth to seventh openings 452, 454, 456 and 458 may be in the second direction at a central portion of each channel block in the third direction.

In example embodiments, at least one of the fourth to seventh openings 452, 454, 456 and 458 may expose not only the upper surface of the base layer 240 but also upper surfaces of the fifth contact plug 260 and the first insulation pattern 250 surrounding the fifth contact plug 260.

In example embodiments, the fourth to sixth openings 452, 454 and 456 may be formed on the first region I of the substrate 100, and the seventh opening 458 may be formed on the second region II of the substrate 100. The fourth opening 452 may be formed to extend in the second direction on a central portion of the first region I of the substrate 100 in the second direction, the sixth opening 456 may be formed on an edge portion of the first region I of the substrate 100 in the second direction, i.e., on an edge portion of the first region I of the substrate 100 adjacent the second region II, the fifth opening 454 may be formed between the fourth and sixth openings 452 and 456. A plurality of seventh openings 458 may be formed to be spaced apart from another in the second direction on the second region II of the substrate 100.

In example embodiments, distances between the fourth to seventh openings 452, 454, 456 and 458 may have proper values such that a subsequent removal process for the sacrificial patterns 325 may be properly performed.

After removing the second mask, the sacrificial patterns 325 exposed by the third to seventh openings 440, 452, 454, 456 and 458 may be removed to form a gap 460 between the second insulation patterns 315 at the respective neighboring levels, and a portion of an outer sidewall of the first blocking pattern 370 and a portion of a sidewall of the semiconductor pattern 360 may be exposed by the gap 460. In example embodiments, the sacrificial patterns 325 exposed by the third to seventh openings 440, 452, 454, 456 and 458 may be removed by, for example, a wet etch process using an etch solution including phosphoric acid and/or sulfuric acid.

The fourth to seventh openings 452, 454, 456 and 458 may be formed between neighboring ones of the third openings 440 in the third direction, and the fourth to seventh openings 452, 454, 456 and 458 may be spaced apart from another in the second direction, and thus the sacrificial patterns 325 may be removed by the wet etching process.

Figure 21:
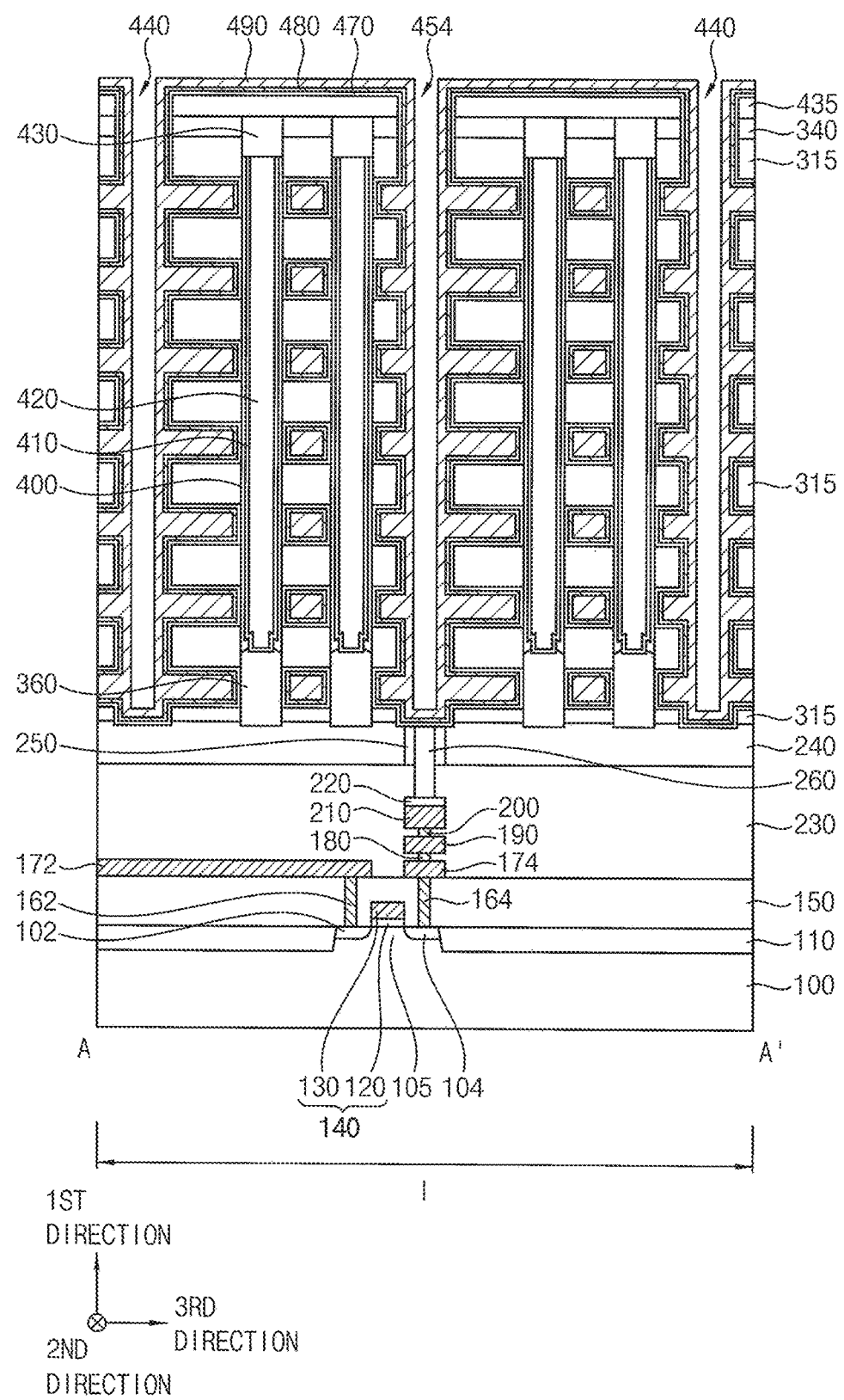

Referring to FIG. 21, a second blocking layer 470 may be formed on the exposed portion of the outer sidewall of the first blocking pattern 370, the exposed portion of the sidewall of the semiconductor pattern 360, an inner wall of the gap 460, surfaces of the second insulation patterns 315, the exposed upper surface of the base layer 240 and an upper surface of the fifth insulating interlayer 435, a gate barrier layer 480 may be formed on the second blocking layer 470, and a gate conductive layer 490 may be formed on the gate barrier layer 480 to sufficiently fill a remaining portion of the gap 460.

The second blocking layer 470 may be formed of or include a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 490 may be formed of or include a metal having a low resistance, e.g., tungsten, titanium, tantalum, platinum, etc., and the gate barrier layer 480 may be formed of or include a metal nitride, e.g., titanium nitride, tantalum nitride, etc. Alternatively, the gate barrier layer 480 may be formed to include a metal layer and a metal nitride layer sequentially stacked.

Figure 22:
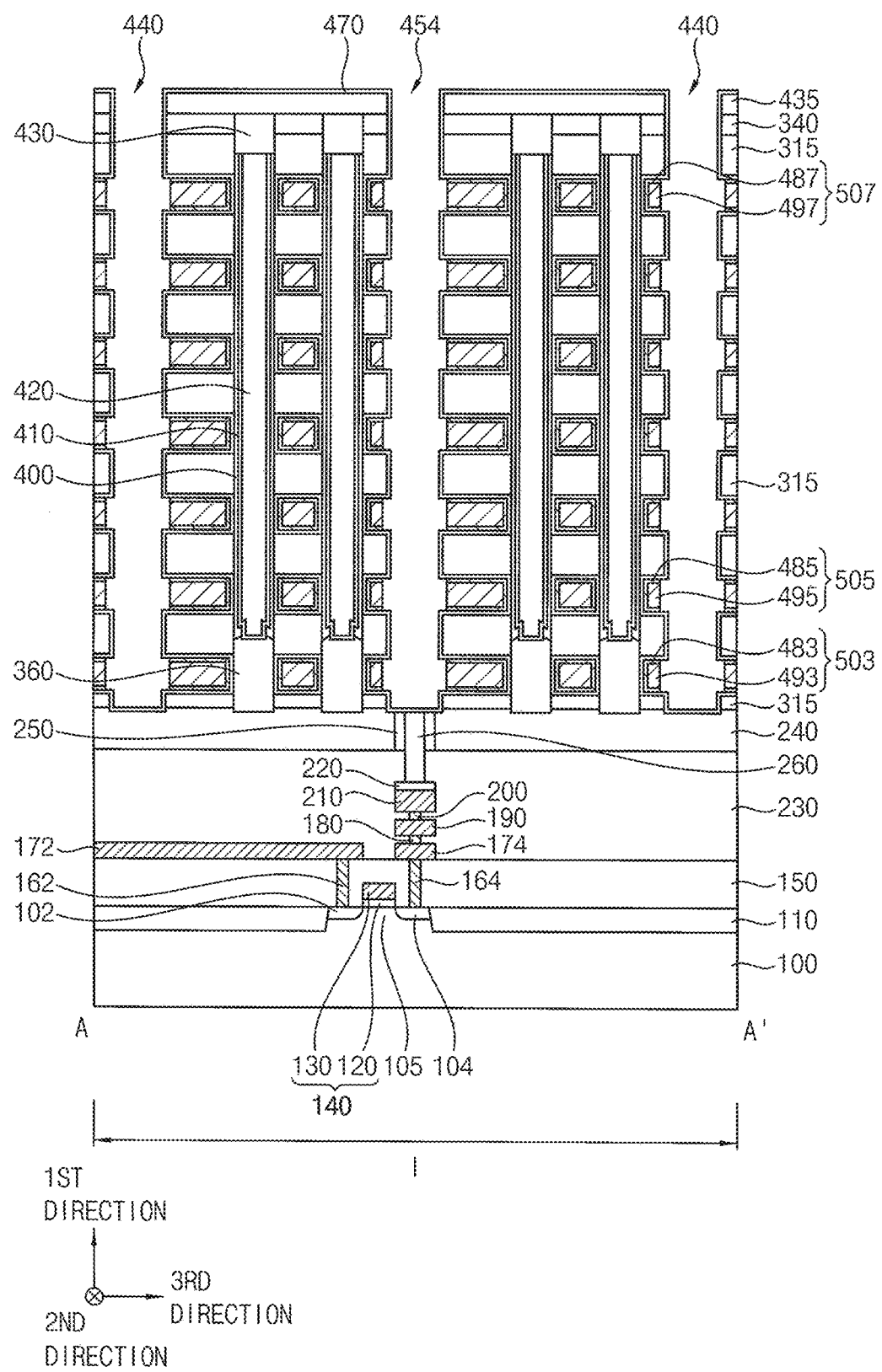
Figure 23:
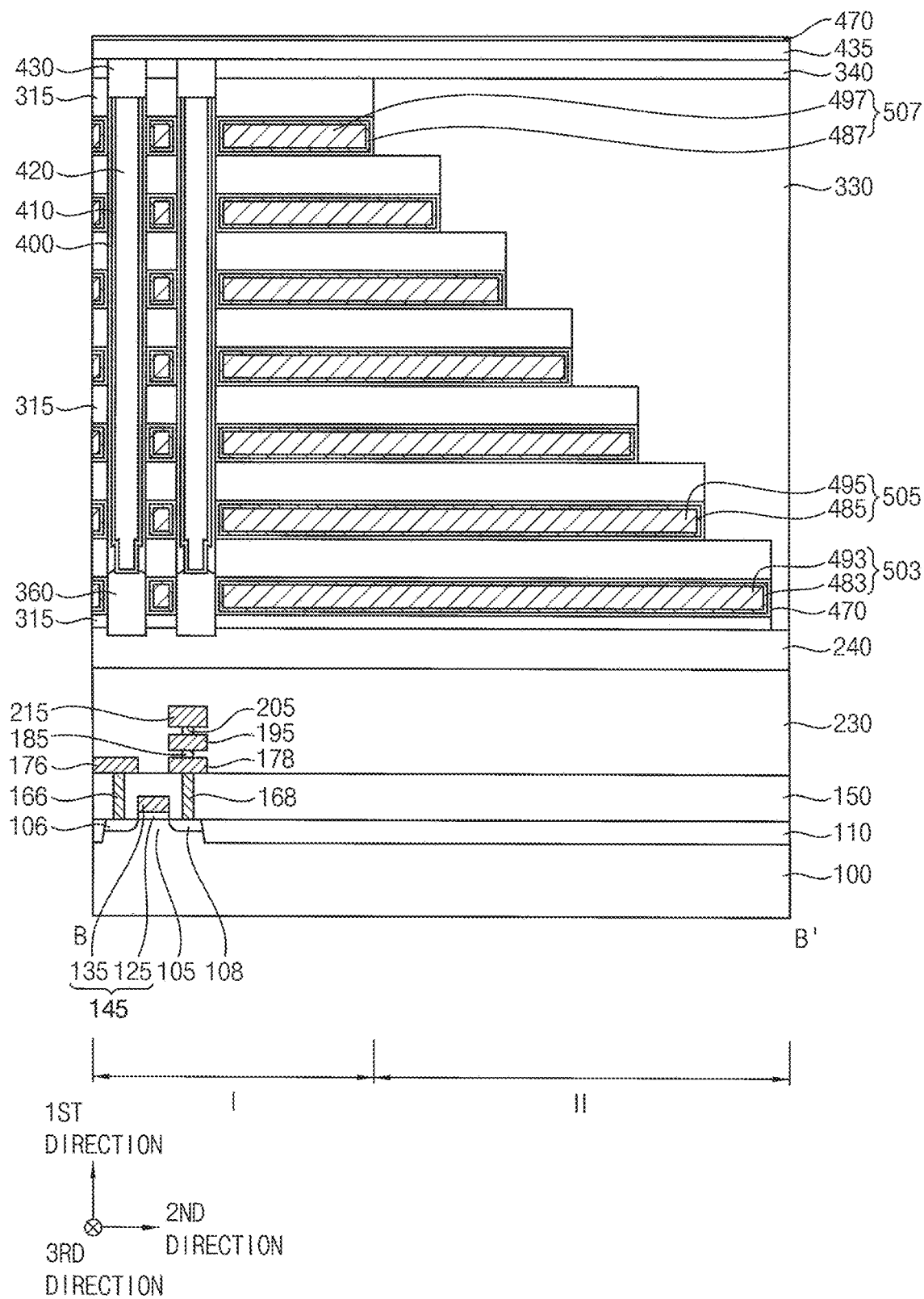

Referring to FIGS. 22 and 23, the gate conductive layer 490 and the gate barrier layer 480 may be partially removed to form a gate conductive pattern and a gate barrier pattern, respectively, in the gap 460, which may form a gate electrode. In example embodiments, the gate conductive layer 490 and the gate barrier layer 480 may be partially removed by a wet etching process.

In example embodiments, the gate electrode may be formed to extend in the second direction, and a plurality of gate electrodes may be formed in the third direction. That is, a plurality of gate electrodes each extending in the second direction may be spaced apart from another by the third opening 440. Additionally, a central portion of at least one of the gate electrodes in the second direction may be spaced apart from another in the third direction by the fourth opening 452.

At least one of the gate electrodes may be formed on the first and second regions I and II of the substrate 100, and a portion of at least one of the gate electrodes on the second region II of the substrate 100 may be referred to as a pad. That is, the gate electrodes may be formed to be spaced apart from another in the first direction, and at least one of the gate electrodes may extend in the second direction on the first and second regions I and II of the substrate 100. End portions of the gate electrodes on the second region II of the substrate 100 may have respective areas gradually decreasing from a bottom level toward a top level, and thus the gate electrodes may have a staircase shape.

The gate electrodes may include a first gate electrode 503, a second gate electrode 505, and a third gate electrode 507 sequentially stacked in the first direction. The first gate electrode 503 may serve as a GSL, the second gate electrode 505 may serve as a word line, and the third gate electrode 507 may serve as an SSL. At least one of the first, second and third gate electrodes 503, 505 and 507 may be formed at one level or at a plurality of levels. One or more than one dummy word lines (not shown) may be further formed between the first and second gate electrodes 503 and 505, and/or between the second and third gate electrodes 505 and 507.

In example embodiments, the first gate electrode 505 may be formed at a lowermost level from the upper surface of the substrate 100, the third gate electrode 507 may be formed at an uppermost level and a closest level to the uppermost level thereunder from the upper surface of the substrate 100, and the second gate electrode 505 may be formed at even numbers of levels between the first and third gate electrodes 505 and 507. Thus, the first gate electrode 503 may be close to a semiconductor pattern 360, and at least one of the second and third gate electrodes 505 and 507 may be close to the channel 410 at a central portion of the second structure.

The first gate electrode 503 may include a first gate conductive pattern 493, and a first gate barrier pattern 483 covering a top, a bottom, and a portion of a sidewall of the first gate conductive pattern 493. The second gate electrode 505 may include a second gate conductive pattern 495, and a second gate barrier pattern 485 covering a top, a bottom, and a portion of a sidewall of the second gate conductive pattern 495. The third gate electrode 507 may include a third gate conductive pattern 497, and a third gate barrier pattern 487 covering a top, a bottom, and a portion of a sidewall of the third gate conductive pattern 497.

FIG. 22 shows the second blocking layer 470 is not partially removed but extends in the first direction, however, inventive concepts may not be limited thereto. That is, the second blocking layer 470 may be partially removed to form a second blocking pattern only on the inner walls of the gaps 460.

Figure 24:
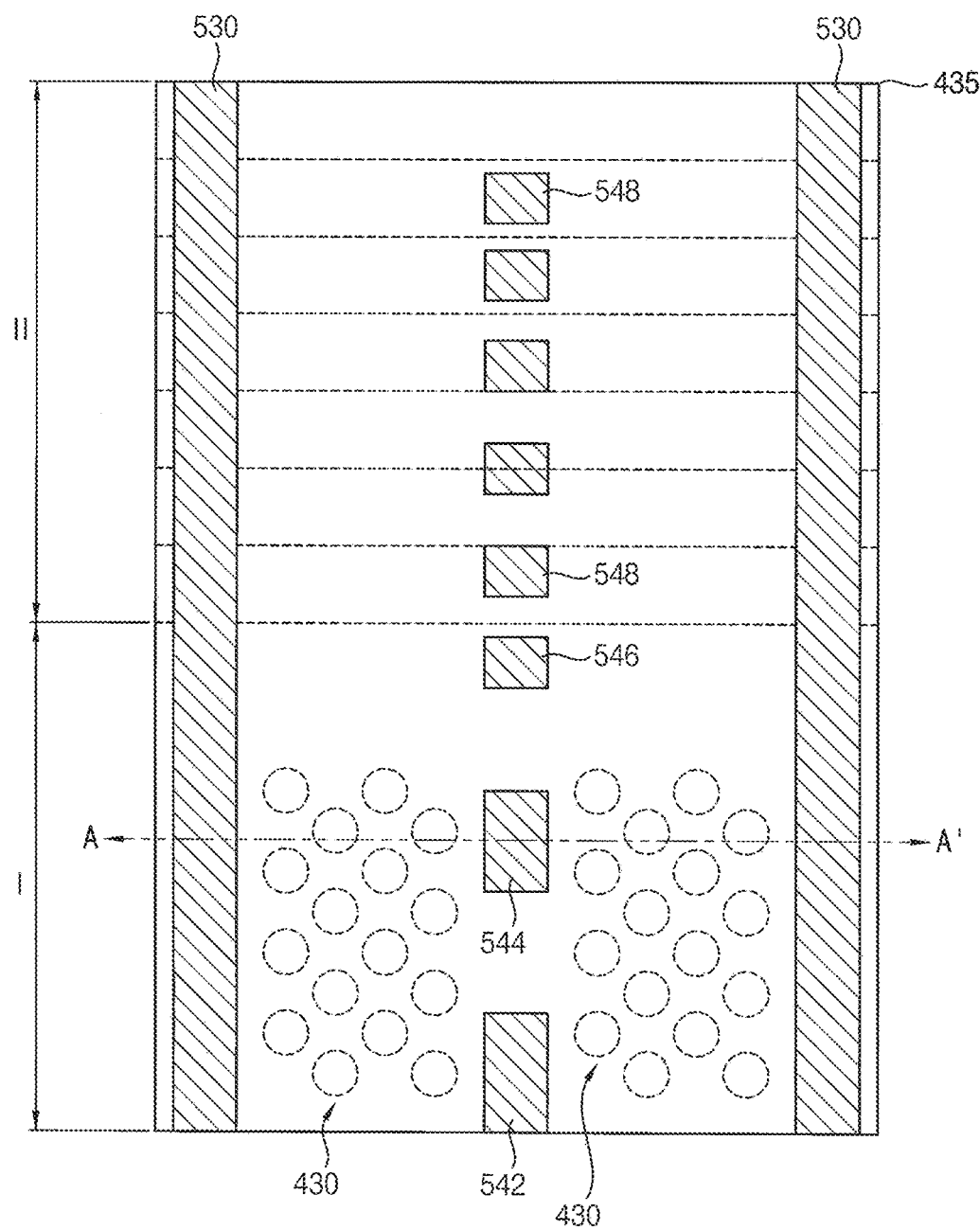
Figure 25:
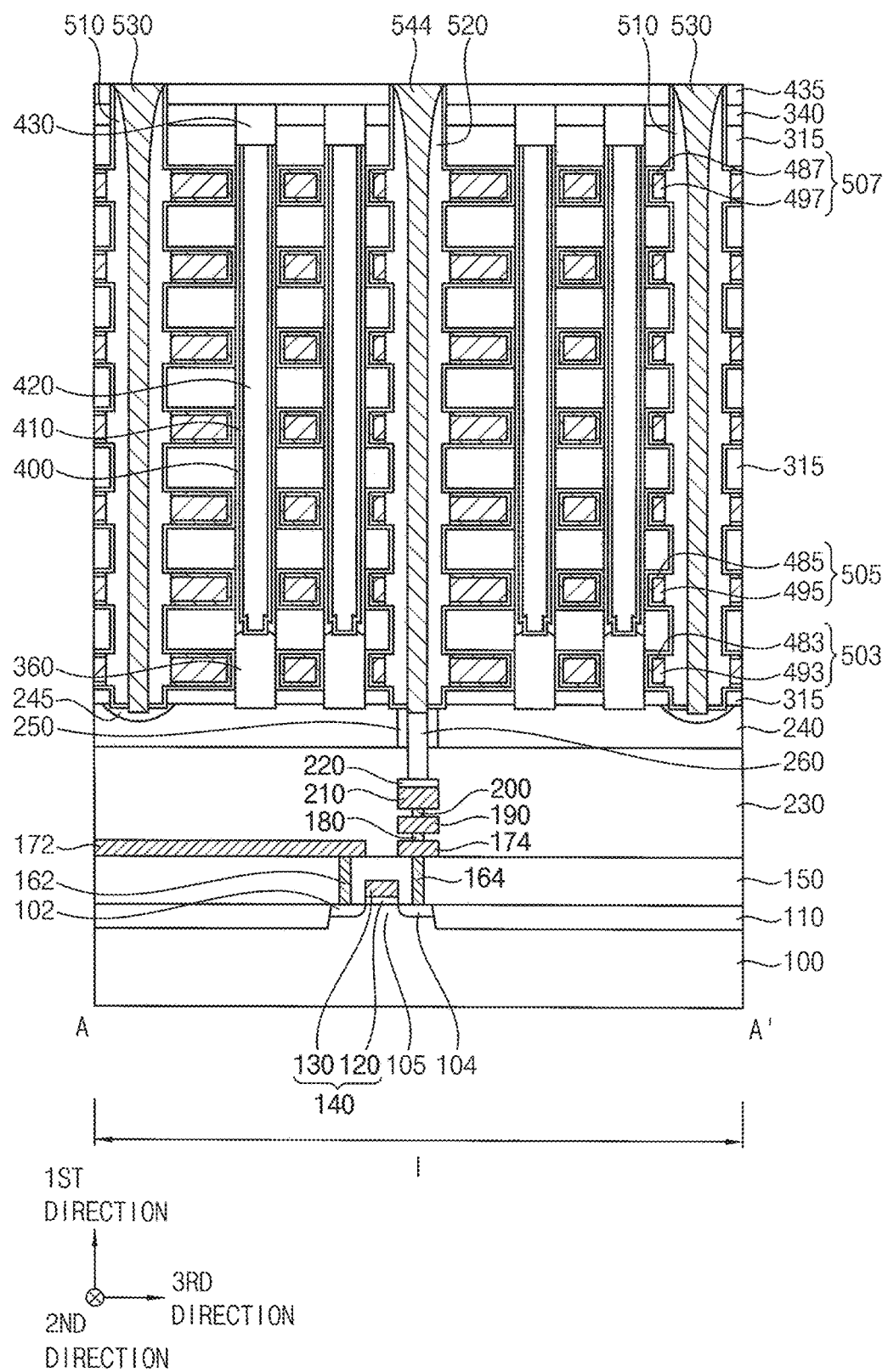
Figure 26:
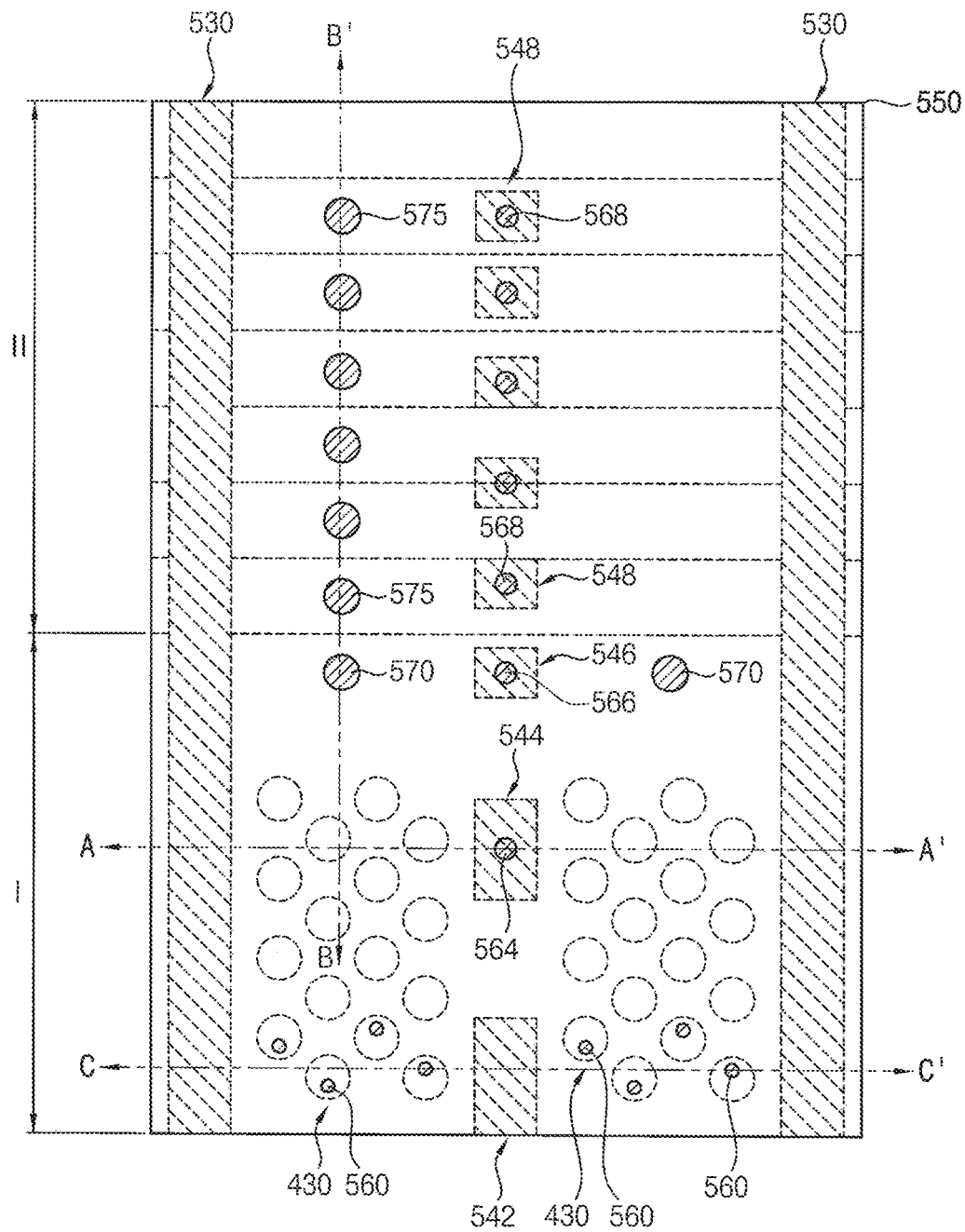
Figure 27:
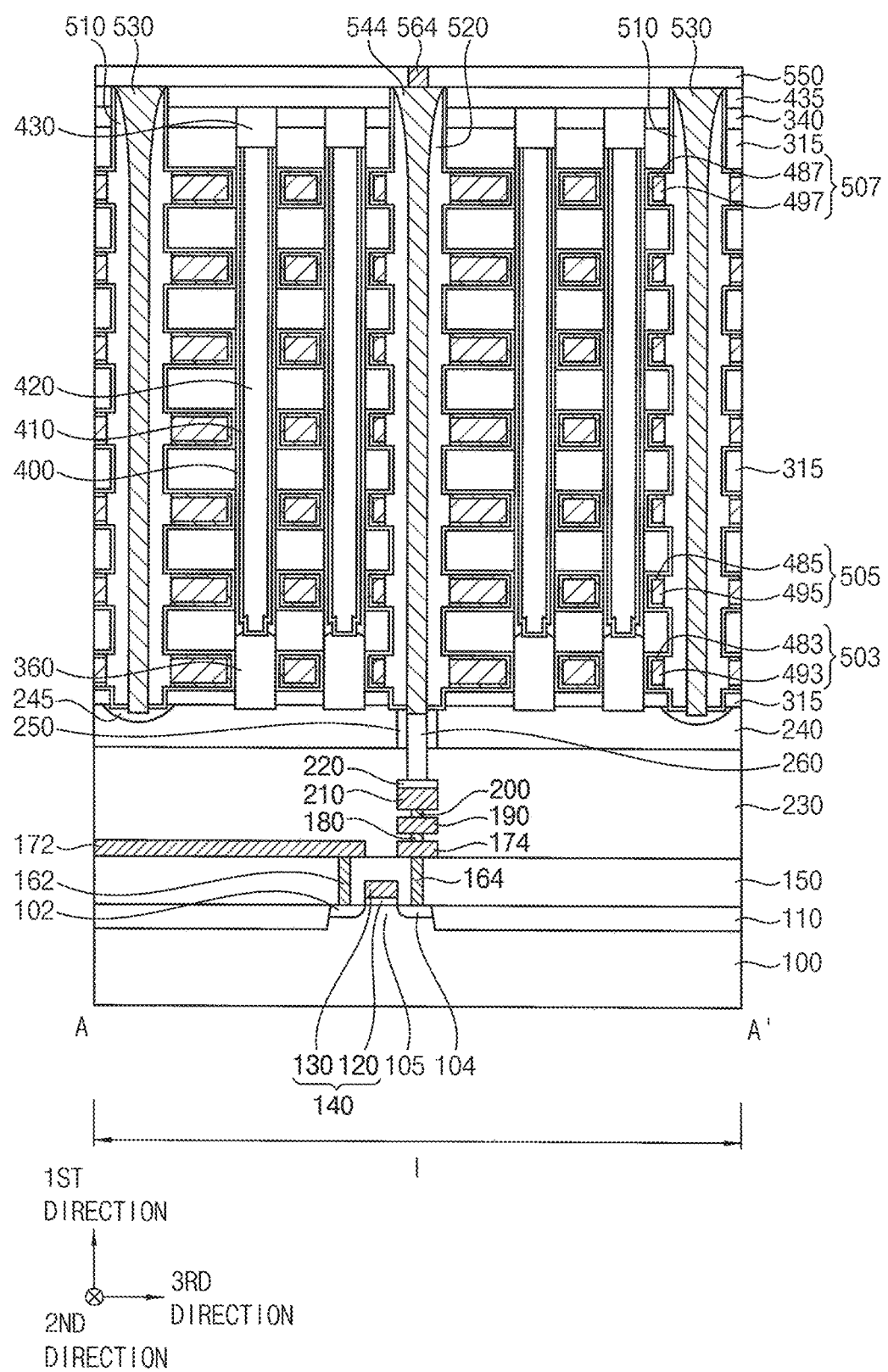
Figure 28:
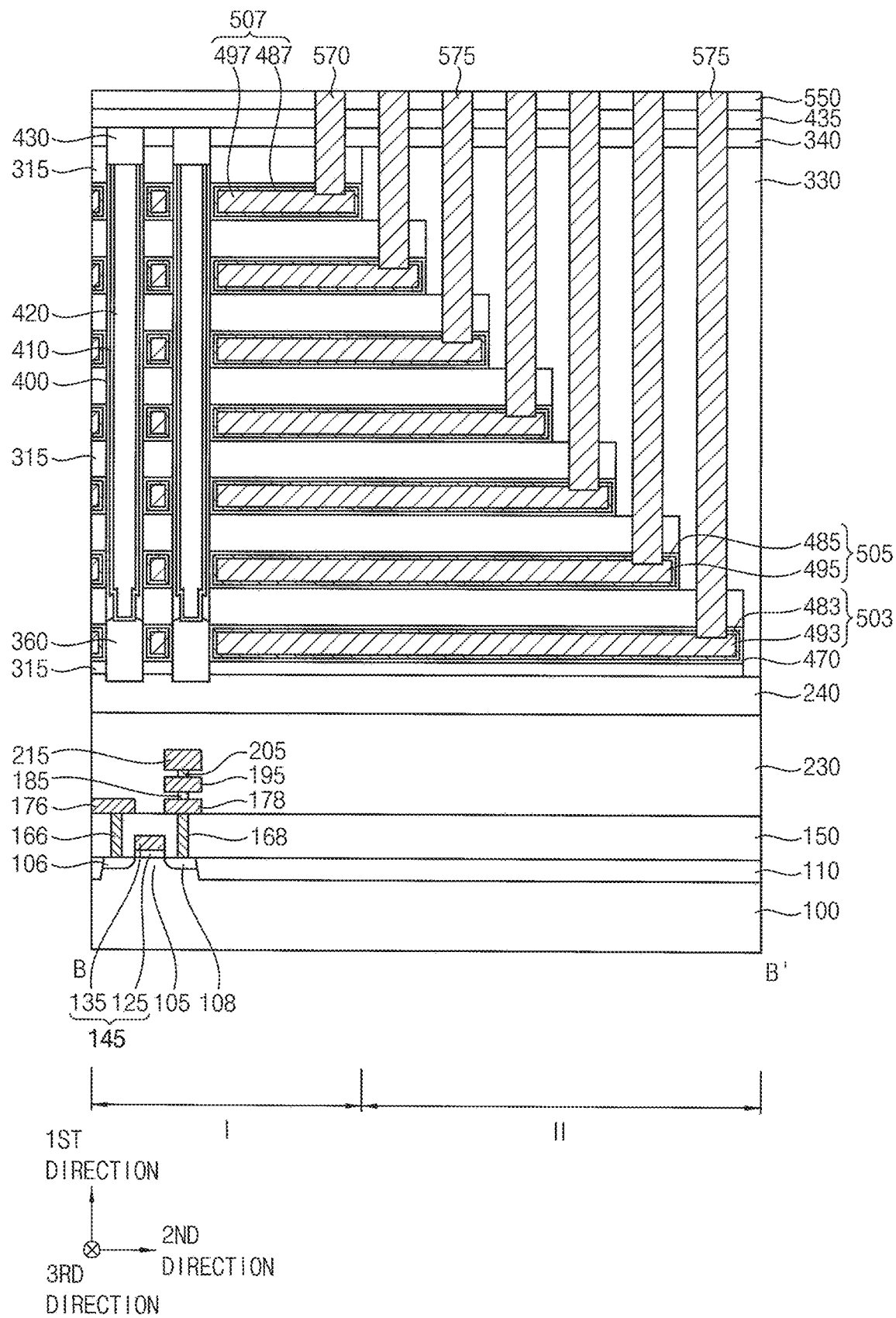

Referring to FIGS. 24 and 25, impurities may be implanted into the exposed upper surface of the base layer 240 by the third and fourth openings 440 and 452 to form a fifth impurity region 245. In example embodiments, the impurities may include n-type impurities, for example, phosphorus and/or arsenic. In example embodiments, the impurities may include p-type impurities, for example, boron.

A second spacer layer may be formed on the exposed upper surface of the base layer 240 by the third to seventh openings 440, 452, 454, 456 and 458, an upper surface of the fifth impurity region 245, an upper surface of the first insulation pattern 250, sidewalls of the third to seventh openings 440, 452, 454, 456 and 458, and an upper surface of the fifth insulating interlayer 435, and may be anisotropically etched to form a second spacer 510 on the sidewall of the third opening 520 and a third spacer 520 on the sidewall of at least one of the fourth to seventh openings 452, 454, 456 and 458. Accordingly, the fifth impurity region 245 at an upper portion of the base layer 240, and an upper surface of the fifth contact plug 260 may be partially exposed. The second spacer layer may be formed of or include an oxide, e.g., silicon oxide.

First and second CSLs 530 and 542 and sixth to eighth contact plugs 544, 546 and 548 may be formed on the exposed fifth impurity region 245 and the fifth contact plug 260 to fill remaining portions of the third to seventh openings 440, 452, 454, 456 and 458.

In example embodiments, a conductive layer may be formed on the exposed fifth impurity region 245, the fifth contact plug 260, the second and third spacers 510 and 520 and the fifth insulating interlayer 435 to fill the third to seventh openings 440, 452, 454, 456 and 458, and may be planarized until the upper surface of the fifth insulating interlayer 435 may be exposed to form the first and second CSLs 530 and 542, and the sixth to eighth contact plugs 544, 546 and 548. A portion of the second blocking layer 470 on the upper surface of the fifth insulating interlayer 435 may be also removed. The conductive layer may be formed of or include a metal, a metal nitride, and/or a metal silicide.

The first and second CSLs 530 and 542 may be formed in the third and fourth openings 440 and 452, respectively. The first CSL 530 may contact the fifth impurity region 245, and the second CSL 542 may contact the fifth impurity region 245 and the fifth contact plug 260.

The sixth to eighth contact plugs 544, 546 and 548 may be formed in the fifth to seventh openings 454, 456 and 458, respectively. At least one of the sixth to eighth contact plugs 544, 546 and 548 may contact the fifth contact plug 260 (refer to FIG. 6).

Referring to FIGS. 26 to 29, a sixth insulating interlayer 550 may be formed on the fifth insulating interlayer 435, the first and second CSLs 530 and 542, the sixth to eighth contact plugs 544, 546 and 548, the second and third spacers 510 and 520 and the second blocking layer 470, and a ninth contact plug 560 penetrating through the fifth and sixth insulating interlayers 435 and 550 to contact an upper surface of the second capping pattern 430, tenth and eleventh contact plugs 561 and 562 (refer to FIG. 2) penetrating through the sixth insulating interlayer 550 to contact upper surfaces of the first and second CSLs 530 and 542, respectively, and twelfth to fourteenth contact plugs 564, 566 and 568 contacting upper surfaces of the sixth to eighth contact plugs 544, 546 and 548, respectively, may be formed.

The sixth insulating interlayer 550 may be formed of or include an oxide, e.g., silicon oxide, and thus may be merged with the underlying fifth insulating interlayer 435. The ninth to fourteenth contact plugs 560, 561, 562, 564, 566 and 568 may be formed of or include a metal, e.g., tungsten, titanium, tantalum, copper, aluminum, etc., and/or a metal nitride, e.g., titanium nitride, tantalum nitride, tungsten nitride, etc.

Fifth and sixteenth contact plugs 570 and 575 may be formed through the third to sixth insulating interlayers 330, 340, 435 and 550, the second insulation patterns 315, the second blocking layer 470, and the gate barrier patterns 483, 485 and 487 to contact upper surfaces of the gate conductive patterns 493, 495 and 497.

The fifteenth contact plug 570 may be formed on an edge portion of the first region I of the substrate 100 adjacent the second region II of the substrate 100 in the second direction in which the staircase shaped pads are formed, and the sixteenth contact plug 575 may be formed on each staircase shaped pad on the second region II of the substrate 100. That is, the sixteenth contact plug 575 may be formed on each pad not covered by underlying pads.

In example embodiments, the sixteenth contact plugs 575 may be spaced apart from another in the second direction by a constant distance. In an example embodiment, the sixteenth contact plugs 575 may be linearly in each memory cell block, in a plan view. Alternatively, the sixteenth contact plugs 575 may be in a zigzag layout in the second direction in each memory cell block, in a plan view.

The fifteenth to sixteenth contact plugs 570 and 575 may be formed of or include a metal, e.g., tungsten, titanium, tantalum, copper, aluminum, etc., and/or a metal nitride, e.g., titanium nitride, tantalum nitride, tungsten nitride, etc.

Referring to FIGS. 1 to 7 again, a seventh insulating interlayer 580 may be formed on the sixth insulating interlayer 550 and the ninth to sixteenth contact plugs 560, 561, 562, 564, 566, 568, 570 and 575, and a bit line 600, first and second dummy bit lines 602 and 603, a signal line 604, and ninth to eleventh wirings 606, 608 and 609 may be formed through the seventh insulating interlayer 580.

In example embodiments, the bit line 600, the first and second dummy bit lines 602 and 603, the signal line 604, and the ninth to eleventh wirings 606, 608 and 609 may be formed by a damascene process, and may be formed of or include a metal, e.g., copper, aluminum, tungsten, titanium, tantalum, etc., and/or a metal nitride, e.g., titanium nitride, tantalum nitride, tungsten nitride, etc.

The bit line 600 may contact an upper surface of the underlying ninth contact plug 560, the second dummy bit line 603 may contact an upper surface of the underlying eleventh contact plug 562, the signal line 604 may contact an upper surface of the underlying twelfth contact plug 564, and the ninth to eleventh wirings 606, 608 and 609 may contact upper surfaces of the underlying tenth, thirteenth and fourteenth contact plugs 561, 566 and 568, respectively. The ninth wiring 606 may contact an upper surface of the underlying fifteenth contact plug 570, and the tenth and eleventh wirings 608 and 609 may contact an upper surface of the underlying sixteenth contact plug 575.

In example embodiments, at least one of the bit line 600 and the first dummy bit line 602 may extend in the third direction, and a plurality of bit lines 600 and a plurality of first dummy bit lines 602 may be formed in the second direction. At least one of the second dummy bit line 603 and the signal line 604 may include a plurality of extension portions each extending in the third direction, and a connection portion for connecting the extension portions to each other. The connection portion of the second dummy bit line 603 may contact an upper surface of the underlying eleventh contact plug 562, and the connection portion of the signal line 604 may contact an upper surface of the underlying twelfth contact plug 564.

In example embodiments, the ninth wiring 606 may include a first extension portion extending in the second direction, and a second extension portion extending in the third direction and being connected to the first extension portion. The tenth wiring 608 may include first and third extension portions each extending in the second direction, and a second extension portion extending in the third direction and being connected to the first and third extension portions. The eleventh wiring 609 may extend in the third direction, or may include first and third extension portions each extending in the second direction, and a second extension portion extending in the third direction and being connected to the first and third extension portions.

The second dummy bit line 603, the signal line 604, the ninth to eleventh wirings 606, 608 and 609 may be connected to other upper wirings.

By the above processes, the vertical memory device may be manufactured. As illustrated above, the lower circuit pattern may be electrically connected to bit line 600, the first and second dummy bit lines 602 and 603, the signal line 604, and the ninth to eleventh wirings 606, 608 and 609 via the fifth contact plug 260, and the fifth contact plug 260 may be formed to overlap the second CSL 542 or the sixth to eighth contact plugs 544, 546 and 548 in the first direction.

Thus, no additional area for forming the fifth contact plug 260 may be needed or desired, or alternatively, and the process for forming the fifth contact plug 260 may be simple.

Figure 30:
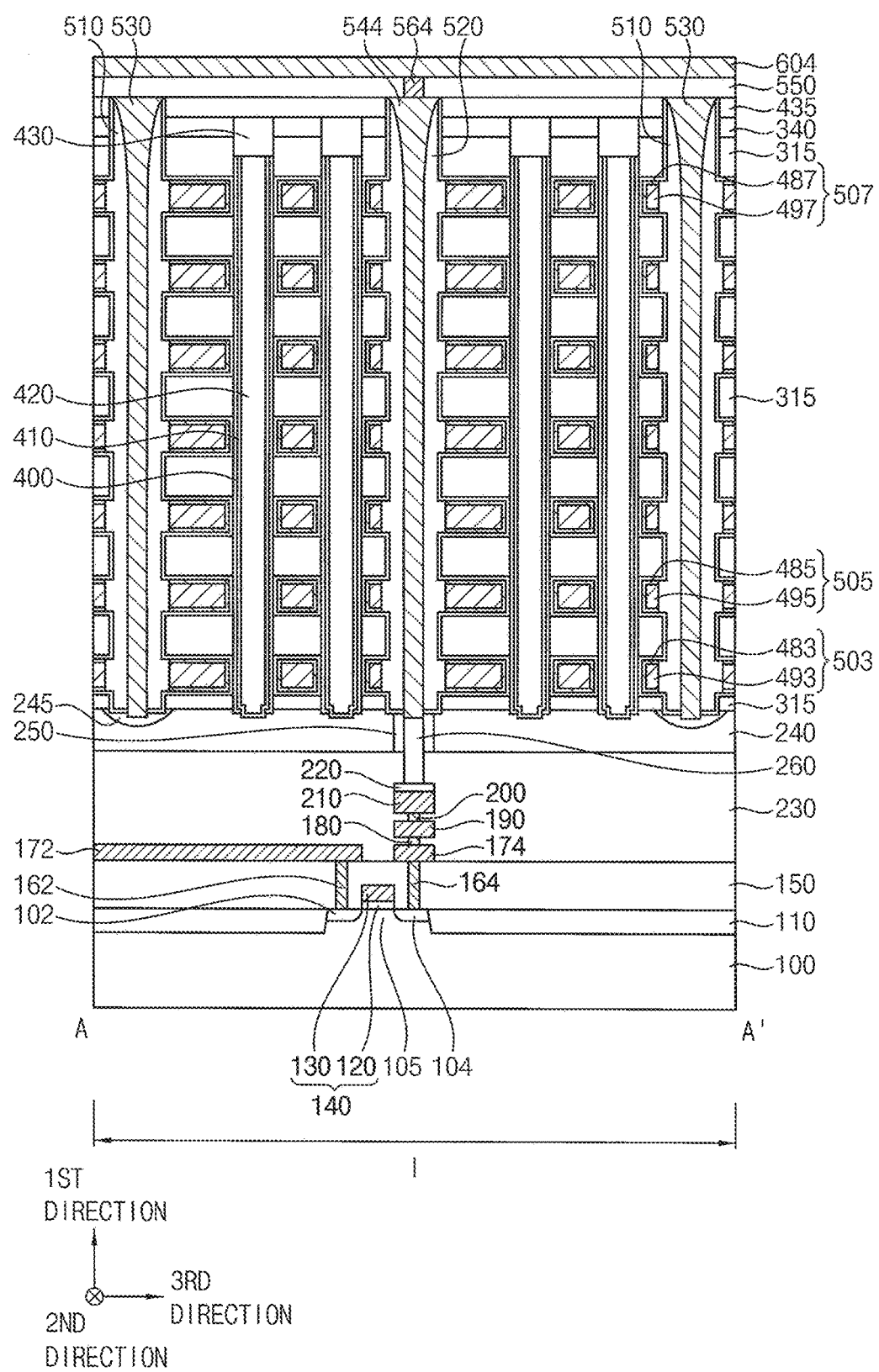
FIG. 30 is a cross-sectional view illustrating a vertical memory device in accordance with example embodiments.

FIG. 30 is a cross-sectional view illustrating a vertical memory device in accordance with example embodiments. This vertical memory device may be substantially the same as or similar to or the same as that of FIGS. 1 to 7, except for the first semiconductor pattern, the channel, and the charge storage structure. Thus, like reference numerals refer to like elements, and detailed descriptions thereon may be omitted below in the interest of brevity.

Referring to FIG. 30, the vertical memory device may not include the semiconductor pattern 360 shown in FIGS. 1 to 7. Thus, the channel 410 may have a cup-like shape contacting the upper surface of the base layer 240, and the charge storage structure 400 may have a cup-like shape of which a central bottom is opened. The charge storage structure 400 may contact the upper surface of the base layer 240, and may cover an outer sidewall of the channel 410.

Figure 31:
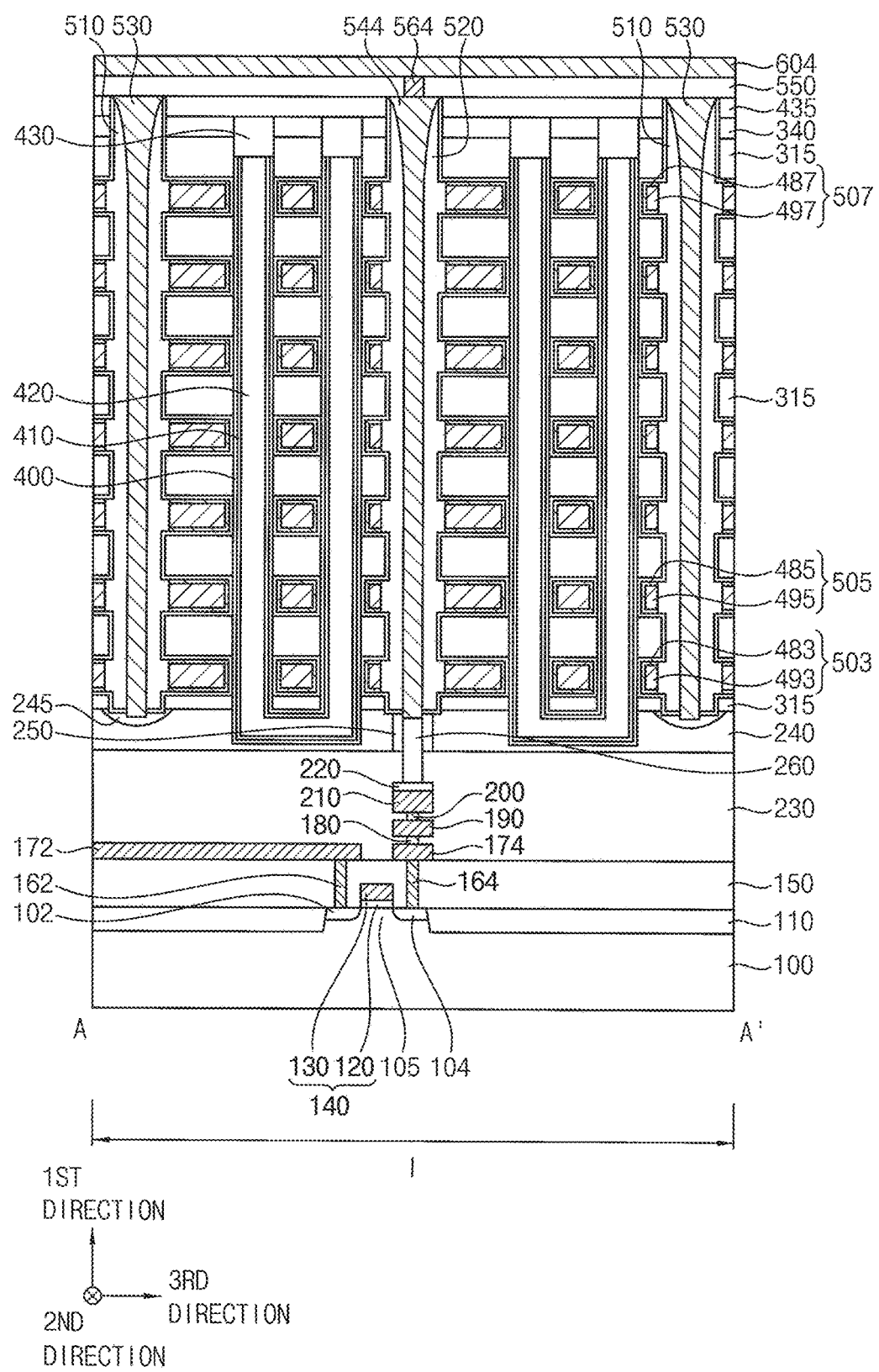
FIG. 31 is a cross-sectional view illustrating a vertical memory device in accordance with example embodiments.

FIG. 31 is a cross-sectional view illustrating a vertical memory device in accordance with example embodiments. This vertical memory device may be substantially the same as or similar to or the same as that of FIGS. 1 to 7, except for the semiconductor pattern, the channel and the charge storage structure. Thus, like reference numerals refer to like elements, and detailed descriptions thereon may be omitted below in the interest of brevity.

Referring to FIG. 31, the vertical memory device may not include the semiconductor pattern 360 shown in FIGS. 1 to 7, and two neighboring channels 410 may be connected to each other through a trench on the base layer 240.

Thus, the charge storage structures 400 covering outer sidewalls of the two neighboring channels 410 may be also connected to each other.

While example embodiments have been particularly shown and described, it will be understood by one of ordinary skill in the art that variations in form and detail may be made therein without departing from the spirit and scope of the claims.

What is claimed is:

1. A vertical memory device, comprising:
a lower circuit pattern on a substrate, the substrate including a cell array region and a pad region;
an insulating interlayer on the substrate, the insulating interlayer covering the lower circuit pattern;
a base layer on the insulating interlayer;
a first insulation pattern extending through the base layer;
first contact plugs each extending through the first insulation pattern and an upper portion of the insulating interlayer in a first direction, the first direction being substantially perpendicular to an upper surface of the substrate, and the first contact plugs being connected to the lower circuit pattern; and
a memory cell block on the base layer between ones of first common source lines (CSLs) on the base layer that neighbor in a third direction substantially parallel to the upper surface of the substrate, each of the first CSLs extending in a second direction substantially parallel to the upper surface of the substrate and crossing the third direction, and the memory cell block including,
a plurality of gate electrodes on the base layer on the cell array region and the pad region of the substrate, the plurality of gate electrodes being spaced apart from another in the first direction and stacked in a staircase shape on the pad region of the substrate,
a channel extending through the plurality of gate electrodes in the first direction on the cell array region of the substrate,
second contact plugs extending through the plurality of gate electrodes, the second contact plugs having a length in the first direction substantially the same as that of the first CSLs, and
a second insulation pattern extending through the plurality of gate electrodes and contacting a sidewall of each of the second contact plugs,
wherein the second contact plugs directly contact upper surfaces of the first contact plugs, respectively, and
wherein at least one of the second contact plugs is disposed on an edge portion of the cell array region of the substrate adjacent to the pad region of the substrate on which the plurality of gate electrodes is stacked in the staircase shape.

2. The vertical memory device of claim 1, wherein the cell array region is at a central portion of the substrate in the second direction, and the pad region is at an edge portion of the substrate in the second direction.

3. The vertical memory device of claim 2, wherein the memory cell block further includes:
a second CSL at a central portion of the memory cell block in the third direction, the second CSL extending in the second direction; and
a third contact plug extending through the first insulation pattern and the upper portion of the insulating interlayer in the first direction to be directly connected to the lower circuit pattern,
wherein the second CSL directly contacts an upper surface of the third contact plug.

4. The vertical memory device of claim 3, wherein bottom surfaces of the first and second CSLs are substantially coplanar with each other.

5. The vertical memory device of claim 4, wherein lengths in the first direction of the first and second CSLs are substantially the same as each other.

6. The vertical memory device of claim 3, wherein each of the first CSL extends in the second direction on both of the cell array region and the pad region of the substrate, and the second CSL extends in the second direction only on the cell array region of the substrate.

7. The vertical memory device of claim 3, wherein the at least one of the second contact plugs is a fourth contact plug, and a fifth contact plug of the second contact plugs is disposed on an edge portion of the cell array region of the substrate adjacent to the pad region of the substrate,
wherein the fifth contact plug is disposed between the second CSL and the fourth contact plug in the second direction.

8. The vertical memory device of claim 3, further comprising:
a bit line extending in the third direction and being electrically connected to the channel; and
a dummy bit line extending in the third direction and being spaced apart from the bit line in the second direction, the dummy bit line being electrically connected not to the channel but to the second CSL.

9. The vertical memory device of claim 1, wherein at least one of the second contact plugs is disposed on the pad region of the substrate.

10. The vertical memory device of claim 9, further comprising:
third contact plugs contacting upper surfaces of the plurality of gate electrodes, respectively, on the pad region of the substrate.

11. The vertical memory device of claim 10, wherein the third contact plugs are electrically connected to corresponding ones of the second contact plugs, respectively.

12. The vertical memory device of claim 1, wherein the second contact plugs include a material different from a material of the first contact plugs.

13. The vertical memory device of claim 1, wherein each of the second contact plugs has a second contact plug lower portion and a second contact upper portion stacked in the first direction, a width of the second contact upper portion being greater than a width of the second contact lower portion.

14. The vertical memory device of claim 13, wherein:
the second contact plugs are spaced apart from each other in the second direction,
the second insulation patterns contacting the sidewalls of the second contact plugs, respectively, are not connected with each other, and
each of the second insulation pattern includes a second insulation pattern lower portion and a second insulation pattern upper portion stacked in the first direction, and a width in the second direction of the second insulation pattern lower portion is greater than a width in the second direction of the second insulation pattern upper portion.

15. A vertical memory device, comprising:
a lower circuit pattern on a substrate, the substrate including a cell array region and a pad region;
an insulating interlayer on the substrate, the insulating interlayer covering the lower circuit pattern;
a base layer on the insulating interlayer;
a first insulation pattern extending through the base layer;
first contact plugs each extending through the first insulation pattern and an upper portion of the insulating interlayer in a first direction, the first direction being substantially perpendicular to an upper surface of the substrate, and the first contact plugs being connected to the lower circuit pattern;
a memory cell block on the base layer between ones of first common source lines (CSLs) on the base layer that neighbor in a third direction substantially parallel to the upper surface of the substrate, each of the first CSLs extending in a second direction substantially parallel to the upper surface of the substrate and crossing the third direction, and the memory cell block including,
a plurality of gate electrodes on the base layer on the cell array region and the pad region of the substrate, the plurality of gate electrodes being spaced apart from another in the first direction and stacked in a staircase shape on the pad region of the substrate,
channels each extending through the plurality of gate electrodes in the first direction on the cell array region of the substrate,
second contact plugs extending through the plurality of gate electrodes, the second contact plugs having a length in the first direction substantially the same as that of the first CSLs, and
a second insulation pattern extending through the plurality of gate electrodes and contacting a sidewall of each of the second contact plugs; and
bit lines each extending in the third direction and being electrically connected to corresponding ones of the channels,
wherein the second contact plugs directly contact upper surfaces of the first contact plugs, respectively, and
wherein at least one of the second contact plugs is disposed on the cell array region of the substrate, and overlaps at least one of the bit lines in the first direction.

16. The vertical memory device of claim 15, wherein the memory cell block further includes:
a second CSL at a central portion of the memory cell block in the third direction, the second CSL extending in the second direction; and
a third contact plug extending through the first insulation pattern and the upper portion of the insulating interlayer in the first direction to be directly connected to the lower circuit pattern,
wherein the second CSL directly contacts an upper surface of the third contact plug.

17. The vertical memory device of claim 16, wherein the at least one of the second contact plugs is a fourth contact plug, and a fifth contact plug of the second contact plugs is disposed on an edge portion of the cell array region of the substrate adjacent to the pad region of the substrate, the fifth contact plug not overlapping any of the bit lines in the first direction, and
wherein the fourth contact plug is disposed between the second CSL and the fifth contact plug in the second direction.

18. The vertical memory device of claim 17, wherein at least one of the second contact plugs is disposed on the pad region of the substrate.

19. A vertical memory device, comprising:
a lower circuit pattern on a substrate, the substrate including a cell array region and a pad region;
an insulating interlayer on the substrate, the insulating interlayer covering the lower circuit pattern;
a base layer on the insulating interlayer;
a first insulation pattern extending through the base layer;
first contact plugs each extending through the first insulation pattern and an upper portion of the insulating interlayer in a first direction, the first direction being substantially perpendicular to an upper surface of the substrate, and the first contact plugs being connected to the lower circuit pattern; and a memory cell block on the base layer between ones of first common source lines (CSLs) on the base layer that neighbor in a third direction substantially parallel to the upper surface of the substrate, each of the first CSLs extending in a second direction substantially parallel to the upper surface of the substrate and crossing the third direction, and the memory cell block including, a plurality of gate electrodes on the base layer on the cell array region and the pad region of the substrate, the plurality of gate electrodes being spaced apart from another in the first direction and stacked in a staircase shape on the pad region of the substrate, a channel extending through the gate electrodes in the first direction on the cell array region of the substrate, second contact plugs extending through the plurality of gate electrodes, the second contact plugs having a length in the first direction substantially the same as that of the first CSLs, and a second insulation pattern extending through the plurality of gate electrodes and contacting a sidewall of each of the second contact plugs, wherein the second contact plugs directly contact upper surfaces of the first contact plugs, respectively, and wherein at least one of the second contact plugs is disposed on the pad region of the substrate on which the plurality of gate electrodes is stacked in the staircase shape.

20. The vertical memory device of claim 19, the at least one of the second contact plugs is one of a plurality of second contact plugs spaced apart from one another in the second direction on the pad region of the substrate.

* * * * *